United States Patent [19]

Schloemann

[11] Patent Number: 4,887,236

[45] Date of Patent: Dec. 12, 1989

[54] NON-VOLATILE, RADIATION-HARD, RANDOM-ACCESS MEMORY

[75] Inventor: Ernst F. R. A. Schloemann, Weston, Mass.

[73] Assignee: Raytheon Company, Lexington, Mass.

[21] Appl. No.: 57,089

[22] Filed: May 29, 1987

[51] Int. Cl.$^4$ .................. G11C 11/40; G11C 11/10
[52] U.S. Cl. ................................ 365/173; 365/154; 365/171
[58] Field of Search ............... 365/154, 171, 172, 173, 365/158

[56] References Cited

U.S. PATENT DOCUMENTS

| | | | |
|---|---|---|---|
| 3,418,646 | 12/1968 | Marcus | 365/228 |
| 3,466,632 | 9/1969 | Wang | 365/173 |
| 3,573,485 | 4/1971 | Ballard | |

FOREIGN PATENT DOCUMENTS 0191892  11/1982  Japan .................................. 365/154

OTHER PUBLICATIONS

"Technology of Ion Beam Sources used in Sputtering" by Harold R. Kaufman, J. Vac. Sci. Technol. 15(2), American Vacuum Society, Mar./Apr. 1978, pp. 272–276.

"Interface Chemistry of Metal-GaAs Schottky-Barrier Contacts" by J. R. Waldrop et al, Appl. Phys. Lett. 34(10), American Institute of Physics, May 1979, pp. 630–632.

"Magnetoresistance Effect of Ni-Fe Film Formed by Ion Beam Sputtering", by Yasuhiro Nagai et al, J. Vac. Sci. Technol., A 4(5), American Vacuum Society, Sep./Oct. 1986, pp. 2364–2368.

"Properties of Fe Single-Crystal Films Grown on (100) GaAs by Molecular-Beam Epitaxy", by J. Kdebs et al, J. Appl. Phys. 61(7), 1 Apr. 1987, pp. 2596–2599.

"Iron Thin Films by Means of Dual Ion-Beam Sputtering" by M. Yamaga et al, IEEE Translation Journal on Magnetics in Japan, vol. TJMJ-1, No. 4, Jul. 1985, pp. 488–190.

"X-ray Characterization of Single-Crystal Fe Films on GaAs Grown by Molecular Beam Epitaxy", by S. B. Oadri et al, J. Vac, Sci. Technol. B, vol. 3, No. 2, Mar.-/Apr. 1985, pp. 719–721.

"Molecular Beam Epitaxial Growth of Single-Crystal Fe Films on GaAs", by G. A. Prinz et al, App. Phys. Lett. 39(5), 1 Sep., 1981, pp. 397–399.

"Single Crystal Fe Films Grown on GaAs Substrates" by W. Wettling et al, Journal of Magnetism and Magnetic Materials, 28 (1982) pp. 299–304.

Primary Examiner—James W. Moffitt
Attorney, Agent, or Firm—Denis G. Moloney; Richard M. Sharkansky

[57] ABSTRACT

A random-access memory having a plurality of memory cells each cell including a magnetic storage element in which the magnetic storage element inlcudes a thin film of magnetic material disposed on a semiconductor substrate and having further disposed thereon transistors connected in a flip-flop type of configuration. In a preferred embodiment of the invention, the magnetic storage element comprises a thin magnetic film that has mutually orthogonal remanent magnetization states used for information storage. A pair of strip conductors used to provide connections to the flip-flop configuration of the transducers are magnetically coupled to the mutually orthogonal remanent magnetization states. By providing the thin film having a pair of mutually orthogonal remanent states used for information storage, a storage cell having a relatively high frequency response is provided.

73 Claims, 19 Drawing Sheets

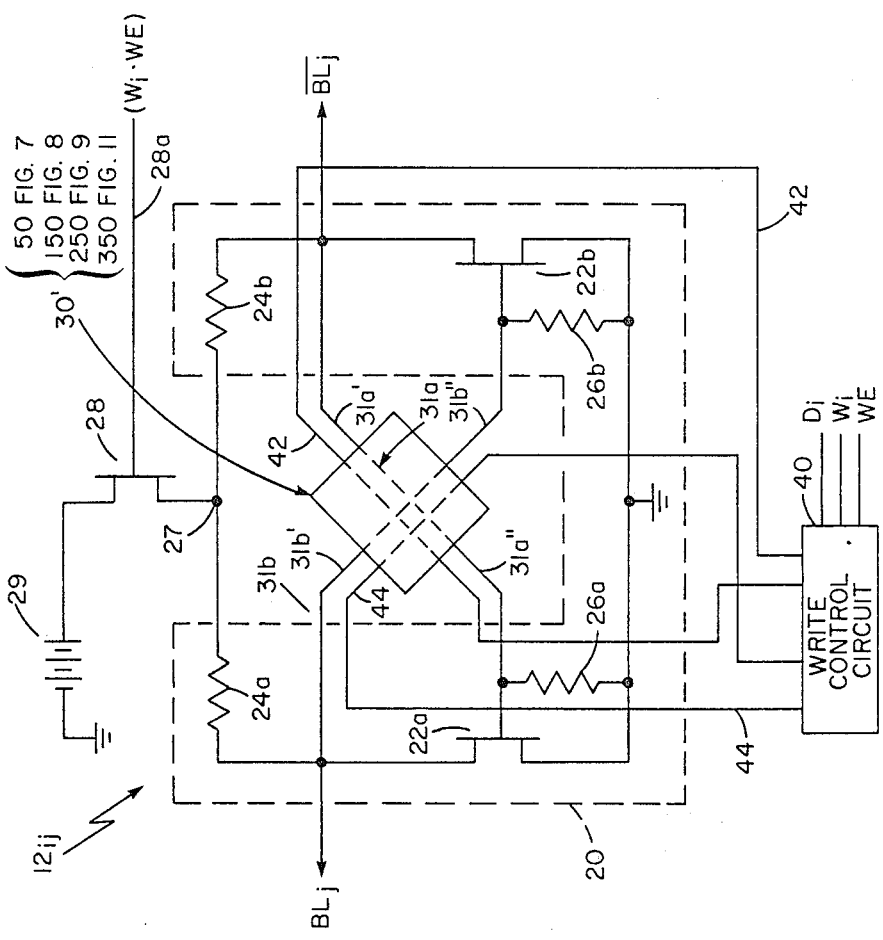
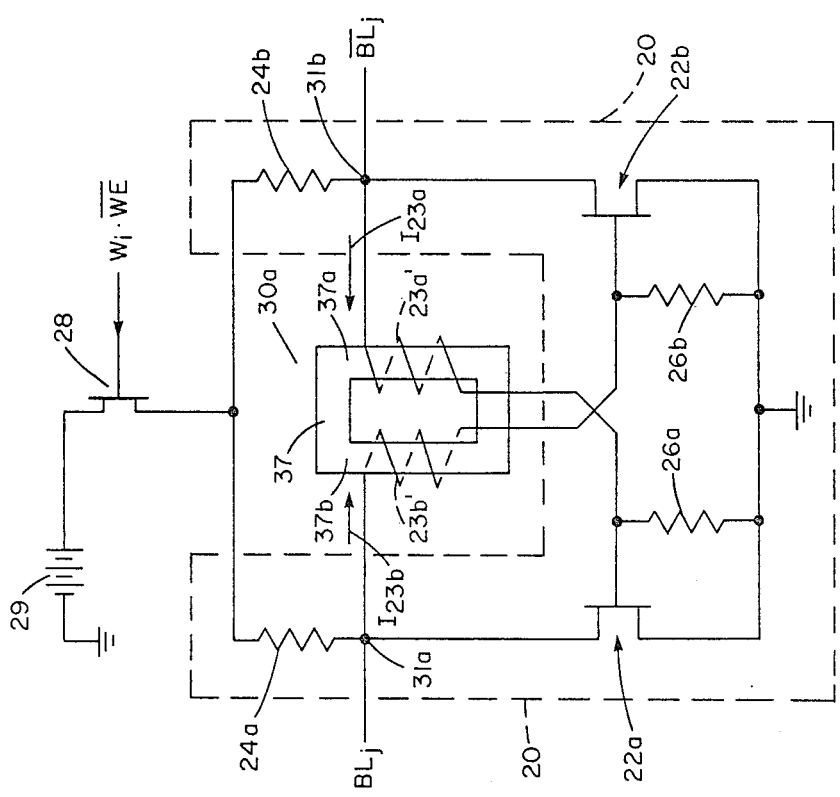
FIG. 6
FIG. 5

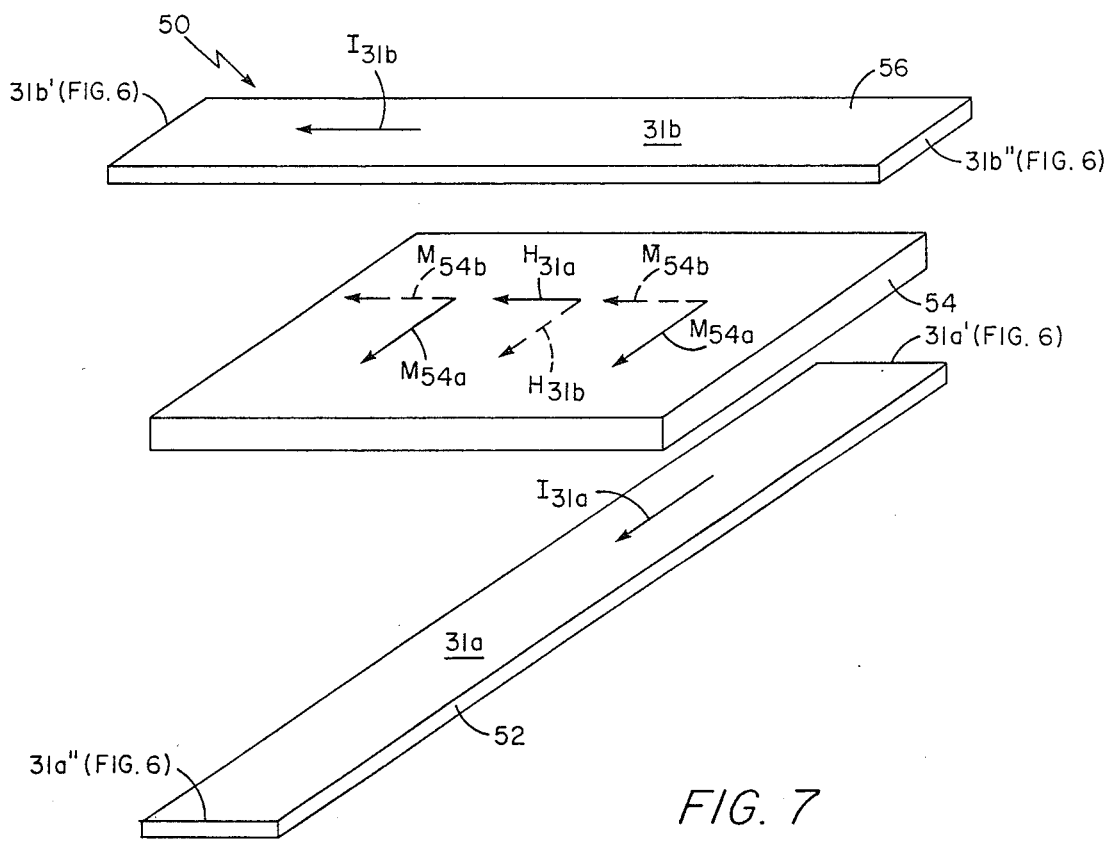
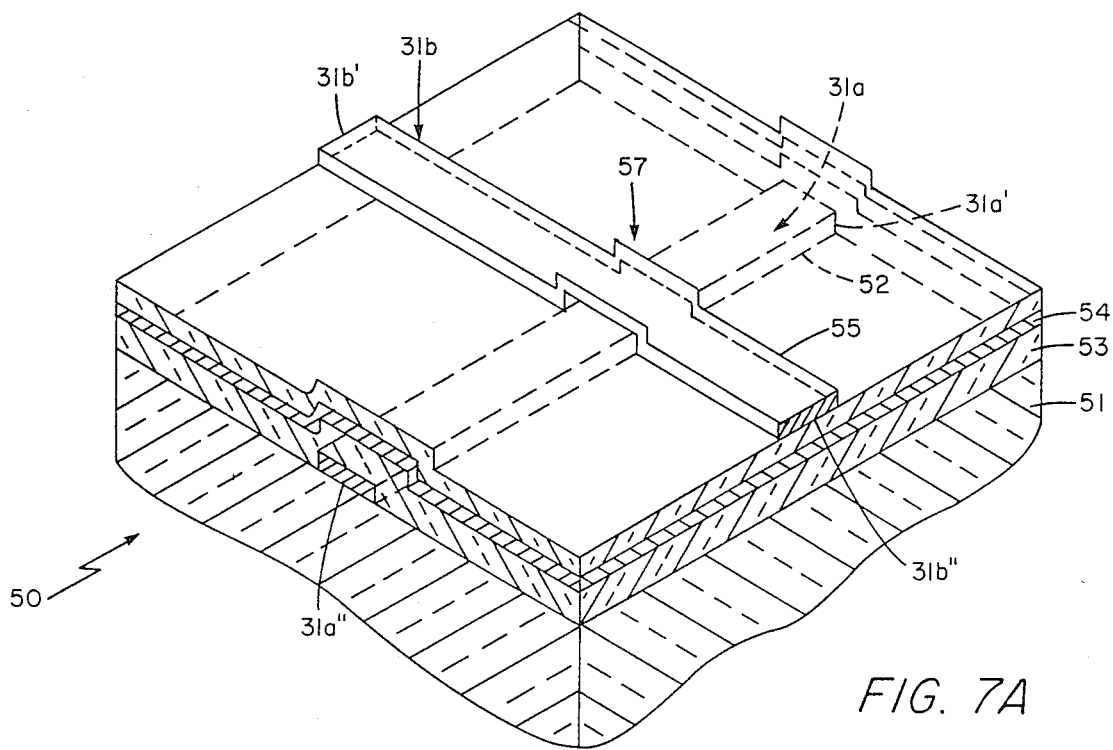
FIG. 7
FIG. 7A

NON-VOLATILE, RADIATION-HARD, RANDOM-ACCESS MEMORY

BACKGROUND OF THE INVENTION

This invention relates generally to memory elements and more particularly to random-access memory elements.

As is known in the art, in a random-access memory information can be read from any random address in the memory or written into any random address in the memory with similar read cycle and write cycle times. There are two general types of random-access memory. The first type of random-access memory is so-called semiconductor random-access memory in which active devices such as transistors are arranged to provide memory storage elements. Semiconductor memories are generally volatile, that is information is lost if power is interrupted, and radiation-soft, that is information is lost if the memory is subjected to ionizing radiation or an electromagnetic pulse beyond certain threshold tolerances. Threshold tolerances depend upon the type of memory elements and the material from which the memory elements are formed. For many applications, semiconductor memories are nevertheless very important. Semiconductor memories are very fast, typically having access times of several nanoseconds and faster, and are relatively inexpensive because the independent memory cells may be packed very close together and, therefore, the information density or the number of bits per unit area is very high. Also, semiconductor memories are fabricated from relatively inexpensive materials using integrated circuit fabrication techniques which further reduces the cost of the memory.

The second type of memory is generally referred to as magnetic memories. With magnetic type memories, the independent storage element or memory cell is a magnetic material or device. Two types of known magnetic memories are ferrite core memories and plated wire memories. These memories are generally non-volatile and radiation-hard. Accordingly, these devices are used in applications where non-volatility is required, as well as, in high radiation environments. However, these memories are also extremely slow and expensive. They are expensive because they cannot be fabricated by inexpensive techniques such as integrated circuit fabrication techniques and their information density is very low particularly when compared to that of semiconductor memories.

Nevertheless, there are many applications which could use a random-access, high density, fast memory, that is radiation-hard and non-volatile. Several approaches are used to compensate for the lack of non-volatile semiconductor RAM. For example, in commercial computer applications, memory elements called "electrical alterable read-only memories" (EAROM) and others known as erasable programmable read only memories EPROM are widely used, often in applications more suitable for non-volatile random-access memory. Neither of these memory types are random access because they may require an erase cycle prior to altering data in the memory elements, and generally the write cycle time is much slower by an order of magnitude or more, than the read cycle time. Further, these memory types are nevertheless "radiation soft", susceptible to upset due to ionizing radiation. Accordingly, these memory types are unacceptable substitutes for magnetic core and plated wire memories in system which may be exposed to high radiation or electromagnetic pulse environments. Therefore, the lack of non-volatility and in particular, radiation-hardness are important considerations which mitigate against the use of a semiconductor memory in certain applications to replace the known types of magnetic memories in high radiation exposure environments.

One memory system described in U.S. Pat. No. 3,573,485, issued to Ballard involves a passive element device such as a ferromagnetic core which is disposed in the path of a semiconductor flip-flop. In previous magnetic core memories, one of the problems associated therewith was that readout from the core was generally destructive, that is when information was read from a particular magnetic core element, the information stored was erased and, therefore, circuits had to be provided which would restore the information to the memory element. U.S. Pat. No. '485 described a technique in which the magnetic storage device such as the core was disposed in the cross-coupled paths of a semiconductor flip-flop which prevented erasure of the core during a read cycle. While this technique represented an improvement to existing core memory, the technique was not sufficiently adaptable to provide a new type of memory, to replace semiconductor RAM memory in high information density applications. The use of a magnetic core did not solve the problems of the slow speed, or expense, since the core is not amenable to high packing density. Furthermore, the magnetic core described in U.S. Pat. No. '485 uses a magnetic element in which remanent magnetizations used for information storage is in either of two opposite polarities. With this arrangement, the process of magnetization reversal proceeds by a mechanism known as domain-wall motion. Domain wall motion, however, is ineffective at higher frequencies and, accordingly these devices are inherently slow. If the magnetic storage device is used in combination with semiconductor flip-flop circuits, it is important to have the magnetic storage device operate with a relatively high or fast response time, comparable to that of semiconductor circuit, typically in the order of 100's of pico seconds to several nanoseconds. Magnetization reversal by means of domain-wall motion is too slow to be significant at these response times.

SUMMARY OF THE INVENTION

In accordance with the present invention, a memory storage element includes means for providing a flip-flop circuit. The memory storage element further includes a magnetic storage element comprised of a thin layer of a magnetic material having a pair of predetermined remanent magnetization states, and a pair of conductors disposed to couple to the remanent magnetization states of the thin layer of magnetic material. The magnetic storage element is disposed to induce an asymmetrical response to said flip-flop circuit. With this arrangement by providing a thin layer of magnetic material, the memory storage element may be integrated into a high density circuit and thus improve the cost effectiveness and speed for a magnetic storage type of random-access memory. Furthermore, by use of the magnetic thin film, the random-access memory will be non-volatile since the magnetic storage element retains the stored information after loss of power, and thus can set the flip-flop circuit to the proper state upon resumption of power. Furthermore, the magnetic storage element will be radiation-hard since the magnetic storage device will be immune to disruption cause by photocurrent flow in the semiconductor portions of the circuit provided in response to ionizing radiation, and after exposure it can set the flip-flop to its original state.

In accordance with an additional aspect of the present invention, the magnetic storage element includes a magnetic thin film storage element having a pair of mutually orthogonal remanent magnetization states, and a pair of conductors magnetically coupled to said pair of mutually orthogonal remanent magnetization states and connected to cross-coupled pair of paths. With this particular arrangement, by providing a magnetic thin film storage element having a magnetic thin film storage element including means for providing a pair of mutually orthogonal remanent magnetization states, the response time for the magnetic storage element is reduced. With mutually orthogonal remanent magnetization polarities, magnetization reorientation proceeds by way of a mechanism known as "domain rotation". Domain rotation is a faster magnetization reorientation process than domain-wall motion. The conductors are disposed to be coupled to the pair of mutually orthogonal remanent magnetization states and one of the conductors will be disposed to be coupled to a remanent magnetization which has already achieved its largest possible value, thereby inducing no change in the direction of the magnetization state. The other conductor will be coupled orthogonally to the magnetization state which is the optimal direction for inducing a high frequency response due to domain rotation. Accordingly, a non-volatile, radiation-hardened high density, and high speed magnetic film storage device is provided.

In accordance with a further aspect of the present invention, the memory storage element comprises a substrate and means including a pair of transistors disposed on said substrate having a pair of cross-coupled paths disposed to provide a flip-flop. A thin film storage element is coupled to said cross-coupled paths and includes a thin magnetic film means having a pair of remanent magnetization states and a pair of conductors magnetically coupled to said pair of magnetization states with said pair of conductors provided to form the pair of cross-coupled paths. The magnetic thin film is disposed on the substrate and comprises an anisotropic magnetic film. The anisotropic magnetic film may be either a natural anisotropic magnetic film or an induced anisotropic magnetic film. With this particular arrangement, the performance of a magnetic film storage device is optimize since the magnetic film has magnetization vectors which are easy to magnetize in a direction parallel or antiparallel to the direction of the anisotropy. This assures that the hysteresis characteristic of the magnetic material is uniform, and is symmetrical so that maximum advantage can be taken of the asymmetrical responses of the flip-flop to the magnetization near the remanent point in each remanent state.

In accordance with a further aspect of the present invention, the substrate comprises gallium arsenide, the transistors are field effect transistors supported over the gallium arsenide substrate, and the magnetic film means include at least one layer of a magnetic material disposed on the substrate. The magnetic material may include Fe, Fe-Co alloys, Fe-Ni alloys, a ferrite, or a garnet. Preferably, the magnetic material is single crystalline, and is a layer of Fe having a pair of mutually, orthogonal easy axis directions which are used as the pair of mutually orthogonal remanent magnetization states. With this arrangement, a naturally anisotropic magnetic layer having a pair of mutually orthogonal remanent states is provided. This layer may be used in the magnetic storage element in the path of the cross-coupled field effect transistors to provide a non-volatile, radiation hard memory.

BRIEF DESCRIPTION OF THE DRAWINGS

The foregoing features of this invention, as well as the invention itself, may be fully understood from the following of the drawings, in which:

FIG. 5 is a schematic diagram of an alternate embodiment of a memory cell of the type shown in FIG. 2 including a single layer thin film magnetic storage element having wrap-around windings in accordance with a further aspect of the present invention;

FIG. 6 is a schematic diagram of a further alternate embodiment of a memory cell including a flip-flop circuit having enhancement mode field effect transistors and a magnetic storage element having a pair of mutually orthogonal remanence states in accordance with a still further aspect of the present invention;

FIG. 7 is an exploded diagrammatical view of a first embodiment of the magnetic storage element for use in the memory element of FIG. 6 including a thin film magnetic layer having mutually orthogonal remanent magnetization states;

FIG. 7A is an isometric view of the storage element described in FIG. 7, disposed over a substrate;

DESCRIPTION OF THE PREFERRED EMBODIMENTS

Figure 1:
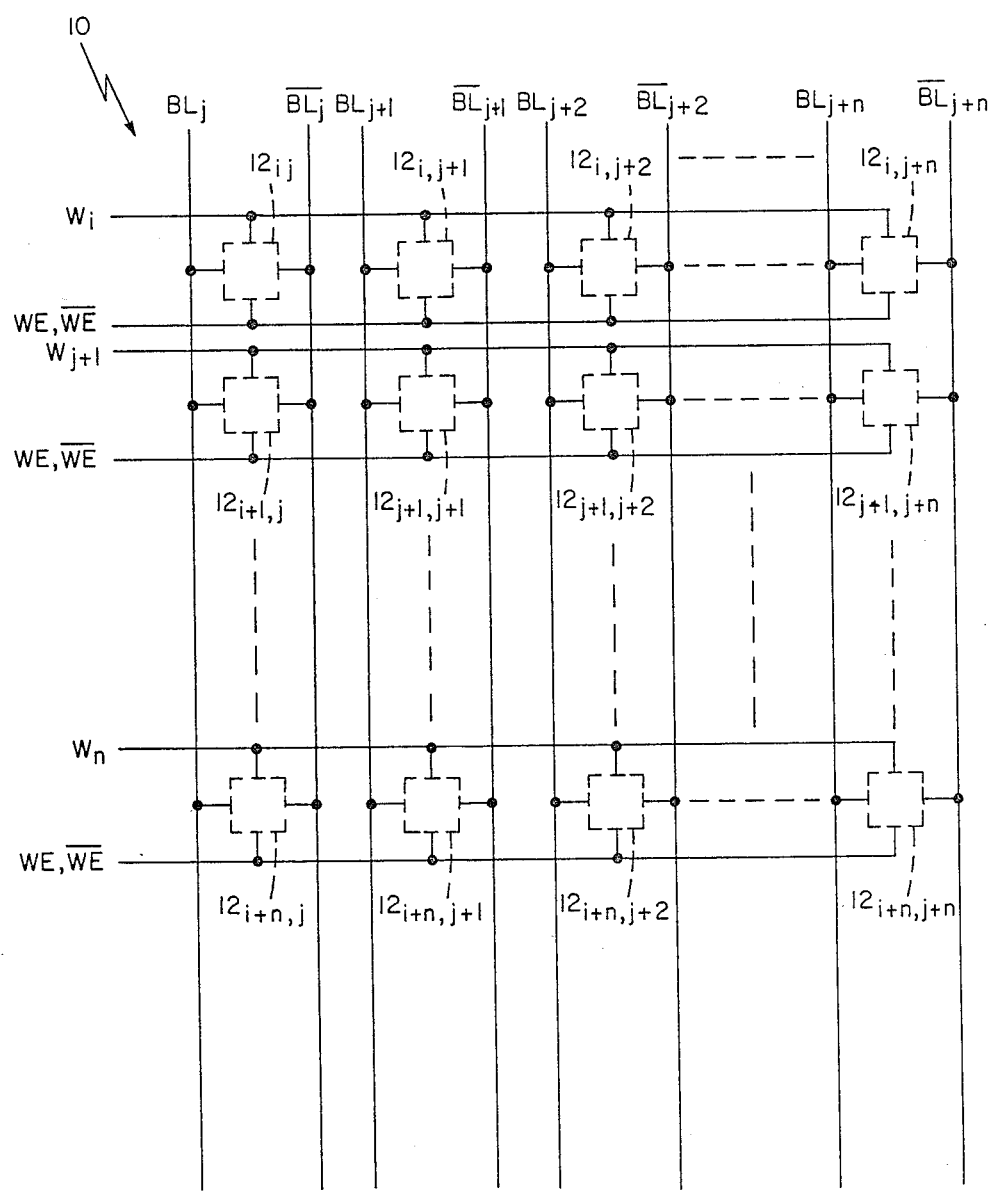
FIG. 1 is a block diagram depicting a typical configuration of memory cells for a random-access memory.

Referring now to FIG. 1 a typical memory array 10 of memory cells $12_{i,j}$ for a random-access memory is shown. Each of the memory cells $12_{i,j}$ are fed by bit lines $BL_j$ and $\overline{BL}_j$ which are respectively the $j^{th}$ bit line and the $j^{th}$ bit complement line in the $j^{th}$ bit position of the memory cell $12_{i,j}$. Each of the memory cells $12_{ij}$ are also fed by one of a predetermined number of word lines $W_i$ which corresponds to an address select, and a write enable WE and read enable $\overline{WE}$. Therefore, as shown in FIG. 1 and as will be described in further detail elsewhere, a 1 or a 0 can be selectively written (WE=1) into and then read ($\overline{WE}$=1) from each one of the memory cells $12_{i,j}$. Not shown but needed are conventional line buffer circuits, address decoder circuits to generate $W_i$, bit line sense circuits, and read and write enable circuits to generate WE and $\overline{WE}$, which interface memory array 10 to external signals. Moreover, it should be appreciated that in certain implementations of a RAM, only one of $BL_j$ and $\overline{BL}_j$ lines are needed to interface to bit line circuits.

Figure 2:
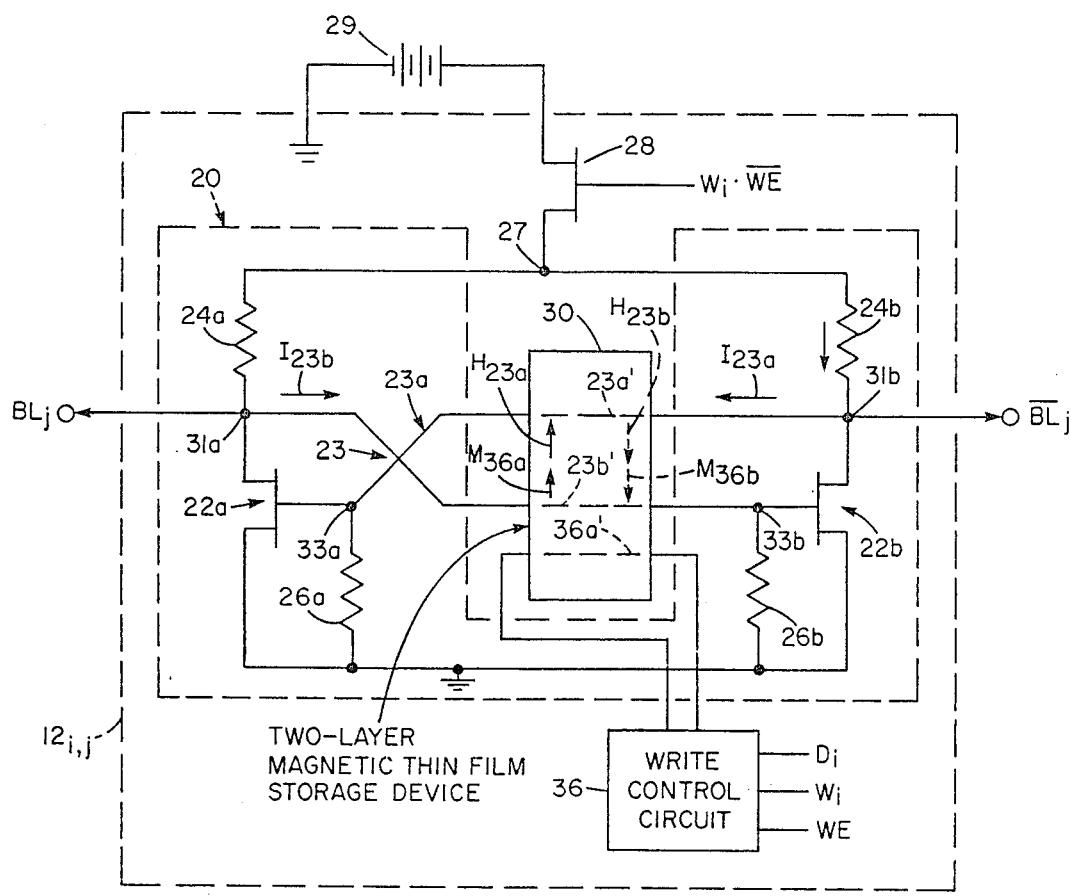
FIG. 2 is a schematic diagram of a memory cell including a flip-flop circuit having enhancement mode field effect transistors and non-volatile magnetic thin film storage element in accordance with a first aspect of the present invention.

Referring now to FIG. 2, an illustrative one of the memory cells here memory cell $12_{i,j}$ of the array 10 (FIG. 1) is shown to include here a semiconductor flip-flop circuit 20 comprising a pair of here enhancement mode, n-channel field effect transistor 22a, 22b having respective source, drain, and gate electrodes, as shown. The drain electrodes of each transistor 22a, 22b are connected to drain bias resistors 24a, 24b which are also coupled at a common node 27. The source electrodes of transistors 22a, 22b are connected to a reference potential, here ground. Disposed between ground and the gate electrodes of transistor 22a, 22b are respectively, resistors 26a and 26b which provide a gate bias circuit for the transistors 22a, 22b. The gate electrode of transistor 22a is cross coupled via a conductor 23a to the drain electrode of transistor 22b, and the gate electrode of transistor 22b is cross coupled, via a second conductor 23b, to the drain electrode of transistor 22a, as shown. The conductors 23a, 23b cross over and are dielectrically spaced from each other at a junction 23. The conductors 23a, 23b each have mutually parallel portions 23a', 23b' which traverse a magnetic storage element 30, as shown. Node 27 which is coupled in common to resistors 24a and 24b is also coupled to the source electrode of a third transistor 28 which has the drain electrode coupled to a suitable voltage source 29. The gate electrode of transistor 28 is coupled to a readout address line, that is, to one of the selected word lines $W_i$. Here a separate write control circuit 36 is shown having a conductor portion 36a' disposed across the magnetic storage device 30 and parallel to conductor portions 23a', 23b', as shown. Write control circuit 36 is fed by word line $W_i$, a write enable line WE and a data line $D_i$ which indicates whether a logic "0" or a logic "1" is to be written into memory element $12_{i,j}$.

The non-volatile memory element $12_{i,j}$ operates as follows: In a write mode, the write control circuit 36 fed by lines $W_i$, WE, and $D_i$ in response provides a current on conductor 36a' in one of two directions across the magnetic storage element 30 sufficient to provide a corresponding one of a pair of opposite remanent magnetization polarities $M_{36a}$, $M_{36b}$ in said thin-film storage device, said pair of opposing remanent magnetization polarities $M_{36a}$, $M_{36b}$ representing a logic "0" and a logic "1". The write current must be large enough to produce a field sufficient to overcome the coercively of the magnetic thin film in order to change the polarity of the remanent magnetization.

During a read mode, a readout address signal ($\overline{WE} \cdot W_i$, for example) is applied to the gate electrode of transistor 28 causing transistor 28 to be in a conductive state and, thereby, provide a voltage potential substantially that of the voltage source 29 at node 27. At this point in time, the two transistors 22a and 22b are open circuits or in a nonconducting state because no bias has yet been applied to the gate electrodes of transistors 22a, 22b. After the node 27, however, is provided at the voltage potential of source 29, currents $I_{23a}$, $I_{23b}$ begin to flow through resistors 24a, 24b, the cross coupled path 23 via conductors 23a, 23b and through resistors 26a, 26b to ground. The currents $I_{23a}$, $I_{23b}$ traverse the magnetic storage device 30 in opposite directions and produce magnetic fields $H_{23a}$, $H_{23b}$ of opposite polarity. If the thin film storage element 30 was biased such that the dominant magnetization direction in the magnetic storage element 30 is parallel to either one or the other of these magnetic fields, the storage device would generate an asymmetry in the voltages which appear at the gates of the two transistors 22a, 22b. At one gate, the voltage across one of the resistors 26a, 26b would be larger and/or appear sooner than at the other, and the transistor with the larger gate voltage will become conductive first. When the transistor with the larger gate voltage becomes conductive, the voltage at the gate of the other transistor will drop and it will remain non-conductive. This will lock the flip-flop 20 in a state where one transistor is conductive and the other transistor is nonconductive. Therefore, appearing at the readout nodes 31a, 31b connected to bit lines $BL_j$ and $\overline{BL}_j$ is either a logic "0" or a logic "1".

As an illustrative example consider that element 30 had a remanent magnetization direction represented by solid arrow $M_{36a}$ which could represent a stored logic "0" state. During a read cycle, a signal ($\overline{WE} \cdot W_i$) is fed to the gate of transistor 28, causing transistor 28 to be placed in a conductive state. In response, currents $I_{23a}$, $I_{23b}$ flow and traverse element 30 in opposite directions. Current $I_{23a}$ would be aided by the direction of remanent magnetization $M_{36a}$, and accordingly would arrive at the gate of transistor 22a before current $I_{23b}$ could arrive at the gate of transistor 22b since $I_{23b}$ is opposed by the direction of remanent magnetization $M_{36a}$. Transistor 22a would in response become conductive causing the voltage at the gate of transistor 23b to drop, placing transistor 22b in an off or nonconducting state. Accordingly, at lines $BL_j$ and $\overline{BL}_j$ would appear respectively approximately 0.2V corresponding to a logic "0" and approximately 3.5 V which would correspond to a logic "1" if supply 29=5 volts.

Thus, in response to ($\overline{WE} \cdot W_i$) fed to the gate of transistor 28, a logic "0" is read from memory element $12_{i,j}$. It should be now appreciated that a logic "0" or logic "1" appears at lines $BL_j$ and $\overline{BL}_j$ only while the word line $W_i$ is active permitting transistor 28 to conduct.

In a similar manner, if the direction of magnetization in element 30 is as represented by the phantom arrow $M_{36b}$, the current $I_{23b}$ would appear at the gate of transistor 22b before $I_{23a}$ appears at transistor 22a. Transistor 22b becomes conductive and transistor 22a becomes nonconductive and in response line, $BL_j$ is placed at a logic "1" state and line $\overline{BL}_j$ at a logic "0" state. Thus, a logic "1" is read from element $12_{i,j}$.

Figure 4:
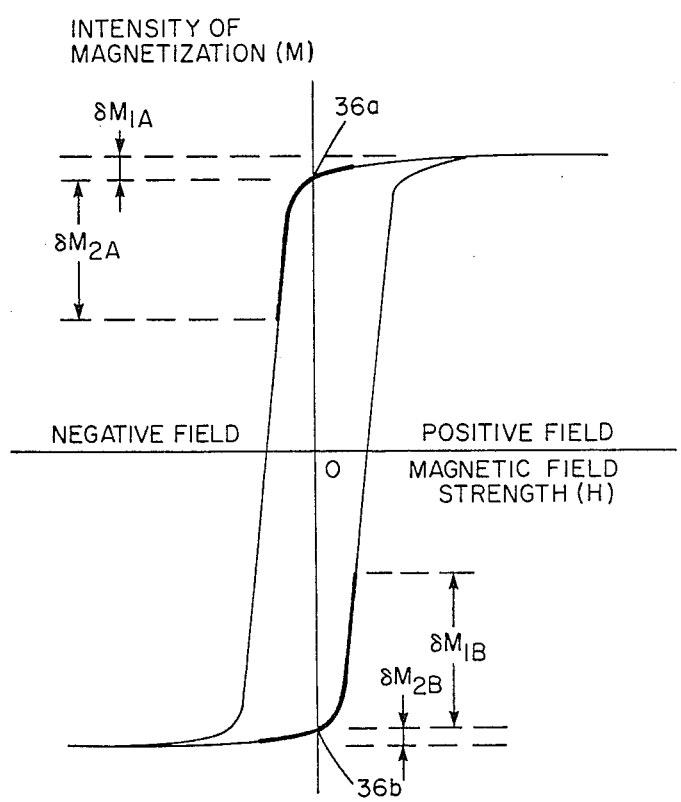
FIG. 4 is a plot of magnetization intensity vs. magnetic field strength showing a typical hysteresis loop for a typical magnetic material, useful to explain the operation of the memory in FIG. 2.

The operation of the non-volatile, rad-hard memory element $12_{i,j}$ described above depends upon the direction of the remanent magnetization of the magnetic storage element 30, and the fact that the change in magnetization ($\delta M$) varies with the polarity of an interrogating current on line portions 23a', 23b' with respect to the polarity of the remanent magnetization $M_{36a}$, $M_{36b}$. This can be best illustrated by referring to FIG. 4, which shows a typical hysteresis curve observed in typical magnetic materials. The two remanent magnetization storage states are shown as 36a for a positive magnetization state and 36b for a negative or opposite magnetization state. If the magnetic element 30 is biased to the positive remanence point 36a and a relatively small magnetic field is applied to it, the magnetization will follow the curve shown as the heavy outline of the magnetization curve in the region of 32a. A positive magnetic field induces a relatively small change in magnetization as indicated by $\delta M_{1A}$, since the positive field will cause the magnetization state to approach the saturation magnetization of the material. On the other hand, if a negative magnetic field is applied when the element is biased at the positive remanence point, a relatively large change in magnetization represented by $\delta M_{2A}$ is provided. Similarly, with the magnetic storage element 30 biased at the negative remanence point 36b, a negative field will induce a relatively small change $\delta M_{2B}$ in magnetization at the negative remanence point 36b whereas a positive magnetic field will induce a relatively large change $\delta M_{1B}$ in magnetization at the negative remanence point 36b. This difference in the magnetic response for the two remanence states of the magnetic circuit is thus used in a non-volatile memory element described in conjunction with FIG. 2 to bias the flip-flop circuit to either a logic 1 or a logic 0 state and, therefore, upon interrogation during the readout cycle as described above, the flip-flop circuit will produce on lines $BL_j$ and $\overline{BL}_j$ states corresponding to logic "0's" and logic "1's" in accordance with the polarity of the remanent magnetization of the magnetic storage element 30.

Figure 2A:
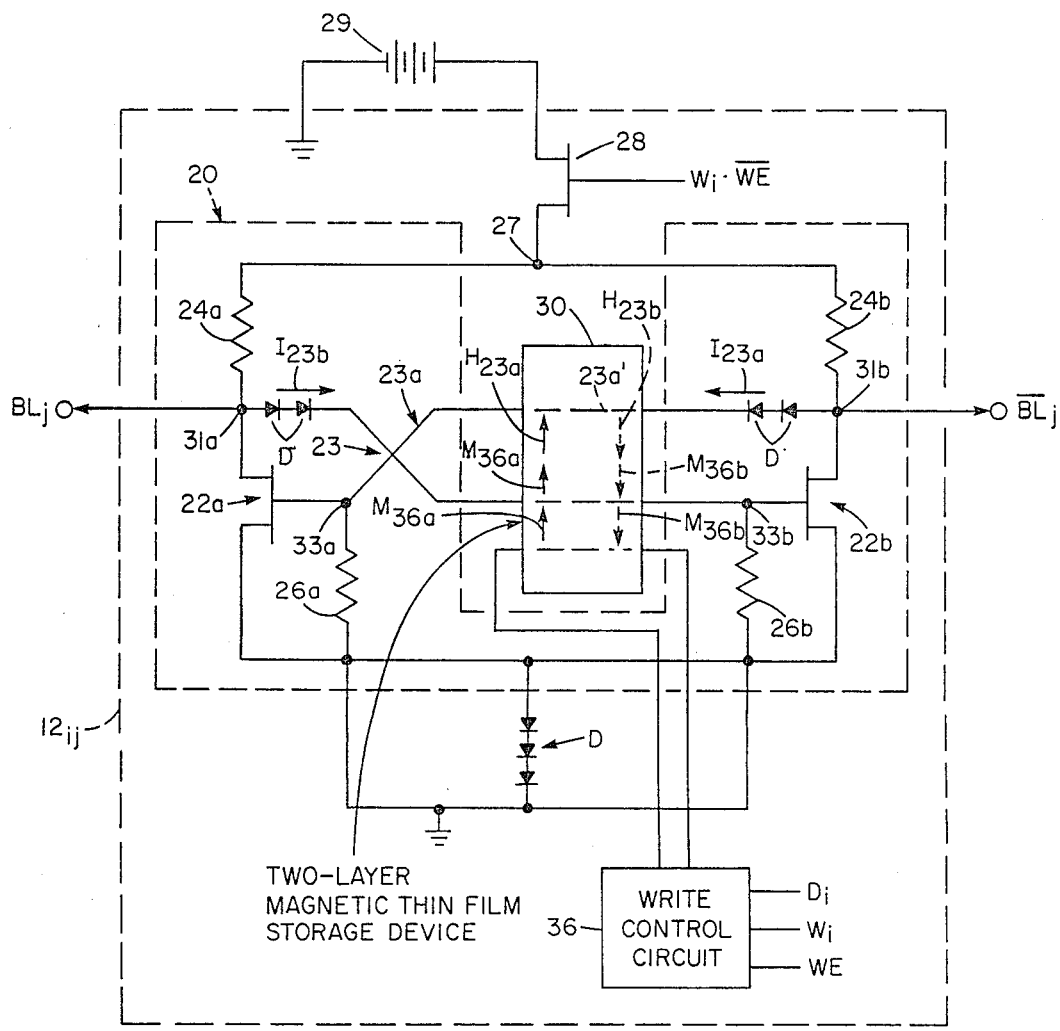
FIG. 2A is a schematic diagram of a memory cell including a flip-flop circuit having depletion mode field effect transistors and non-volatile magnetic thin film storage element in accordance with a further aspect of the present invention.

Referring now to FIG. 2A, the flip-flop circuit 20 is here shown comprised of depletion mode transistor 22a', 22b', and 28'. Diodes D are inserted as shown to provide the proper voltage levels to the circuit $12_{i,j}$. In all other respects, operation of the device is similar to that shown in FIG. 2 except for the differences presented by the diodes D and depletion mode transistors 22a', 22b', and 28'.

Figure 3:
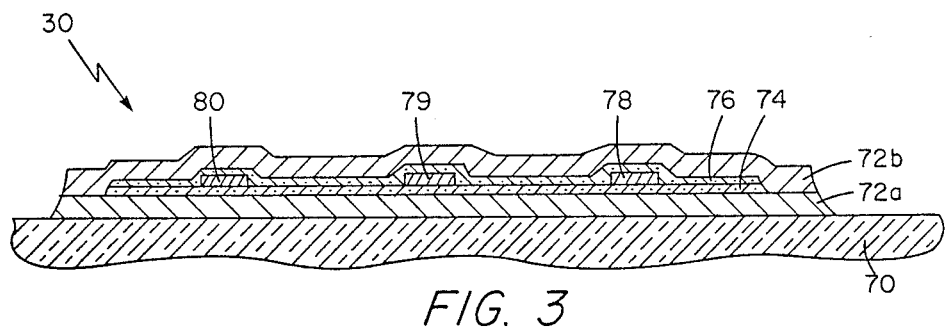
FIG. 3 is a cross-sectional view of a two-layer magnetic thin film storage element for use in the memory cell of FIG. 2.

Referring now to FIG. 3, a preferred embodiment of the magnetic storage element 30 for the non-volatile memory element $12_{i,j}$ described in conjunction with FIG. 2, for example, is shown. Here, a two-layer magnetic thin film storage element embodiment of the element 30 is shown. It is to be understood that the magnetic storage element $12_{i,j}$ is formed on a semiconductor substrate 70 and has transistors 22a, 22b, and 28 (not shown in FIG. 3) formed as conventional field effect transistor as is known. Also formed on the substrate 70 are conductors, and resistors 24a, 24b, 26a, and 26b (not shown) which are here also field effect transistors having open or floating gates or source coupled gates which provided predetermined resistive impedances, as is also known.

The magnetic storage element 30 is disposed over substrate 70 here comprising gallium arsenide, silicon or other suitable semiconductor material. Disposed over the substrate 70 is a first magnetic material layer 72a having a thickness typically between 0.05 microns to 1.0 micron, comprising a magnetic material such as permalloy. Disposed over the first magnetic material layer 72a is here a first insulating layer 74 comprising an oxide such as silicon oxide. Disposed on the silicon oxide layer are three conductors 78, 79, 80 portions which correspond to conductors 23a', 23b' and 36' of FIG. 2. A second insulating layer 76 here also of silicon oxide is then disposed over conductors 23a', 23b', and 32a', as shown. A second magnetic material layer 72b here of permalloy is then disposed over the insulating layer 76 in contact with the first magnetic layer 72a. Accordingly, the insulating layers 74 and 76 electrically isolate the conductor portions 23a', 23b', and 32a' from the conductive permalloy magnetic material. However, if a nonconducting magnetic material such as a ferrite or garnet would have been used, the insulating layers 74 and 76 could have been omitted. The pair of permalloy layers 72a, 72b have peripheral portions which are in contact with one another as shown, and accordingly provide a closed magnetization path for the remanent magnetizations. Other material which may be suitable for layers 72a, 72b are other NiFe alloys, Co-Fe alloys and Fe, for example.

Referring now to FIG. 5, an alternate embodiment 30a of the memory storage element 30 is shown interconnected to the flip-flop current 20 and address transistor 28, as described in conjunction with FIGS. 1–4. Here, however, a single layer thin film having a toroidal configuration is used. A pair of wrap around conductors 23a', 23b' are disposed in opposite legs 37a, 37b of the element 30', as shown. The conductors 23a', 23b' are fabricated using conventional air bridge overlay techniques as generally used in photolithographic processing of semiconductor circuits.

Write circuits have been omitted from this view but obviously could be corresponding conductor patterns which interlace conductor portions 23a', 23b' or can be write circuits as will be described in conjunction with FIG. 10.

Figure 6A:
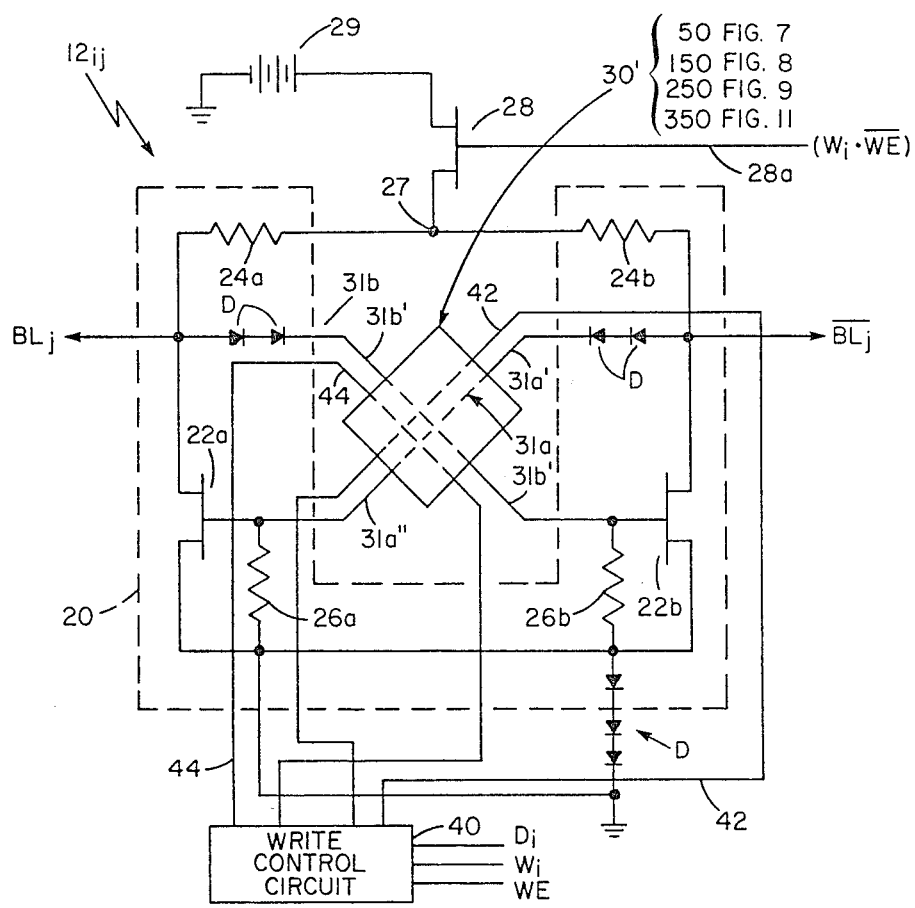
FIG. 6A is a schematic diagram of a further alternate embodiment of a memory cell including a flip-flop circuit having depletion mode field effect transistors and a magnetic storage element having a pair of mutually orthogonal remanence states in accordance with a still further aspect of the present invention.

Referring now to FIG. 6, an alternate embodiment for a memory storage element $12'_{i,j}$ is shown to include the flip-flop 20, as generally described in conjunction with FIG. 1, a preferred thin film magnetic storage element 30' which may have any one of several preferred configurations, as will be described in conjunction with FIGS. 7–23 and a write circuit 40 connected to a pair of mutually orthogonally disposed conductors 42, 44 for directing a current to change the orientation of magnetization in the device 30' to one of the pair of mutually orthogonal remanent magnetization states used for information storage. Suffice it here to say, that the magnetic storage element 30' has a first pair of ports 31a', 31a" which are coupled between the drain electrode of transistor 22b and the gate electrode of transistor 22a and a second pair of ports 31b' and 31b" which are coupled between the drain electrode of transistor 22b and the gate electrode of transistor 22a to provide a cross-coupled connection for the flip-flop circuit 20. Here, enhancement mode field effect transistors are shown, however, depletion mode transistors as described in conjunction with FIG. 2A may also be used.

The basic operation of the memory element $12_{i,j}$ is essentially the same as described in conjunction with FIG. 2. However, here the magnetic storage element 30' comprises a magnetic material having a pair of mutually orthogonal remanent magnetization states used for information storage. Unlike examples described in conjunction with FIGS. 1–5, where the magnetic thin film storage element 30 had a pair of remanent states having magnetization of opposite polarity, the magnetic thin film storage element 30' to be described has remanent states having magnetization of mutually orthogonal polarity which is an optimum condition for inducing a high frequency response to an interrogating magnetic field.

It is well known that in the absence of an applied magnetic field ferromagnetic materials generally comprise many regions or "domains" in which the spontaneous magnetic moment of the material has different orientations. In most ferromagnetic materials, these domains are randomly orientated leaving the total magnetization of the system at or close to zero in the absence of an applied field. When a small magnetic field is applied to the system, the net magnetization of the system changes direction. Two mechanisms may be involved in the process. The first of these is "domain-wall motion" which involves the growth of domains favorably orientated relative to the direction of the applied magnetic field at the expense of unfavorable orientated neighbors. Domain-wall motion is ineffective at high frequencies because of the inertia of the domain walls. At high frequencies, the magnetization reorientation must proceed by a mechanism known as "domain rotation". Domain rotation involves the simultaneous rotation of magnetic dipoles within a domain until alignment in the direction of the field is accomplished. The storage element 30' to be described in conjunction with FIGS. 6–10 are arranged to take advantage of domain rotation during the process of reorientating the magnetization vector of the storage element 30'.

Preferred examples of the magnetic storage element 30' having magnetization vectors which are mutually orthogonal in the remanent states used for information storage are described in conjunction with FIGS. 7–12.

Referring now to FIGS. 7, 7A, a first preferred embodiment 50 of the magnetic storage element 30' having a pair of mutually orthogonal remanent states used for information storage is shown disposed over the substrate 51 which may also support the transistors 22a, 22b, and 28 and resistors 24a, 24b, 26a, and 26b, as described in conjunction with FIG. 3 to provide an integrated memory storage element. Storage element 50 includes a first strip conductor 52 disposed over substrate 51 and is comprised of an electrically conductive material such as gold. Disposed over the first strip conductor 52 and electrically isolated from the first strip conductor 52 by a insulating layer 53 FIG. 7A (not shown in FIG. 7) is a thin magnetic film layer 54 which is preferentially disposed to provide a pair of mutually orthogonal magnetization remanent states $M_{54a}$, $M_{54b}$ used for information storage. Disposed over the magnetic layer 54 is a second insulating layer 55 (FIG. 7A not shown in FIG. 7) which is used to electrically isolate a second strip conductor 56 from the magnetic layer 54. The second strip conductor 56 is disposed orthogonal to the first strip conductor 52. Strip conductor 56 is disposed to cross over dielectrically spaced, underlying strip conductors 52 in a region denoted as 57 (FIG. 7A). Accordingly, region 57 here provides the cross-coupled paths for the flip-flop 20.

As mentioned previously, the magnetic thin film layer 54 has a pair of mutually orthogonal remanent magnetization states $M_{54a}$, $M_{54b}$. The direction of the magnetic moment of these states is shown schematically in FIG. 7 as solid lines $M_{54a}$ and phantom lines $M_{54b}$ respectively.

Referring again to FIG. 6 and also to FIG. 7, the memory storage element $12'_{i,j}$ having the magnetic storage element 30' here the first embodiment thereof 50 stores a logic "0" or a logic "1" state in the magnetic storage element 30' as follows. In the write mode, signals are fed to write control circuit 40 and in response a current is generated in one of current paths 42 and 44, (not shown in FIG. 7) which selectively magnetizes the magnetic thin film layer 54 in a direction indicated by either arrows $M_{54a}$ or $M_{54b}$. These states correspond respectively to a logic "1" state and a logic "0" state.

During a read mode, operation of the memory element $12'_{i,j}$ is as follows. A readout address signal is fed to line 28a which may be the logical product ($W_i \cdot \overline{WE}$) and causes transistor 28 to be placed in a conductive state, thereby coupling the potential represented by source 29 substantially to the junction 27. At this juncture, transistors 22a and 22b are in a nonconducting state and currents begin to flow in each of the branches of the flip-flop circuits through conductor paths 31a and 31b. Current $I_{31a}$, $I_{31b}$ will produce magnetic fields $H_{31a}$, $H_{31b}$ having directions on layer 54 orthogonal to the direction of the respective currents, as shown. For the first remanent state represented by solid arrow $M_{54a}$ in magnetic layer 54, the direction of the magnetic field $H_{31a}$ is orthogonal thereto, which is the optimum direction for inducing a high frequency response due to domain rotation. Accordingly, current $I_{31a}$ will be delayed a finite time as it propagates along conductor 31a.

On the other hand, the current on conductor 31b has a direction indicated by the solid arrow $I_{31b}$ and has a magnetic field component indicated by arrow $H_{31b}$ which is parallel to the direction of magnetic moment $M_{54a}$ and accordingly, since the magnetic layer 54 already has achieved its largest possible magnetization value, no change in magnetization would be induced in the layer 54 and the current $I_{31b}$ will not be delayed.

With this arrangement, the current being fed through conductor 31b will arrive at the gate electrode of transistor 22b prior to the arrival of the current at the gate electrode transistor 22a. Therefore, transistor 22b will be placed in a conducting state causing the voltage at the gate of transistor 22a to drop thereby preventing transistor 22a from being placed in conducting state. Accordingly, on line $\overline{BL}_j$ a logic "0" will appear and on line $BL_j$ a logic "1" will appear. Thus, indicating that the direction 54a was used to store a logic "1".

Similarly, when the remanent magnetization is in the state 54b, the current on line 31b will be delayed relative to the current on line 31a, thereby causing transistor 22a to be placed in a conducting state and transistor 22b to be placed in a nonconducting state and thus, enabling a logic "0" to be placed on line BL and a logic "1" to be placed on line $\overline{BL}$, thus indicating that direction 54b was used to store a logic "0".

Set forth below is a theoretical explanation why the orthogonal direction is the optimal direction for inducing a high frequency response due to domain rotation. It can be shown that the relative permeability ( ) of the magnetic layer 54 in the case where the magnetic field is parallel to the magnetic moment is unity since no change is induced in the current flow. For the case where the magnetic field is orthogonal to the magnetic moment, the relative permeability is given by equation (1) (neglecting any loss terms):

$$\mu = \frac{(\omega_m + \omega_a)^2 - \omega^2}{\omega_m(\omega_m + \omega_a) - \omega^2} \quad (1)$$

where $\omega$ is the angular velocity of the interrogating magnetic field, $\omega_m = \gamma 4\pi M_s$, is a characteristic frequency proportional to the saturation magnetization $M_s$ and $\omega_a = \gamma Ha$ is a characteristic frequency proportional to the strength of the built-in magnetic field or anisotropic field Ha in the remanent state, and $\gamma$ is the gyromagnetic ratio. Accordingly, the response of the magnetic storage element 50 is significantly different between a current on the top conductor 31b and a current on the bottom conductor 31b, as shown in FIG. 7.

It will now become apparent that when the direction of the remanent magnetization is in the second state 54b, that the magnetic field generated by the bottom conductor will be parallel to said remanent magnetization whereas the magnetic field generated in the current in the top conductor will be orthogonal to said remanent magnetization and accordingly, a high frequency response due to domain rotation will be induced by the top conductor in the second state. This phenomenon, accordingly, is used in the embodiment shown in FIG. 6 to change the magnitude and/or time of arrival of the currents at the gate electrodes of transistor 22a, 22b. Therefore, the nonsymmetrical response to the currents generated on conductors 31a, 31b will enable one of the transistors 22a, 22b to be placed in a conductive state which will lower the voltage at the gate of the other one of the transistors 22a, 22b placing it in a nonconducting state.

The embodiment shown in FIG. 7 has a single thin film element having a pair of mutually orthogonal remanent states. For some magnetic film materials, the pair of remanent states may not be stable unless the magnetic films have a high coercivity, the coercivity of the material being the magnetic field strength at which the magnetic induction field is zero. Magnetic films with high coercivity can be prepared, however, the use of such films often has the disadvantage of requiring a high magnetic field strength for writing information into the magnetic storage element.

Figure 8:
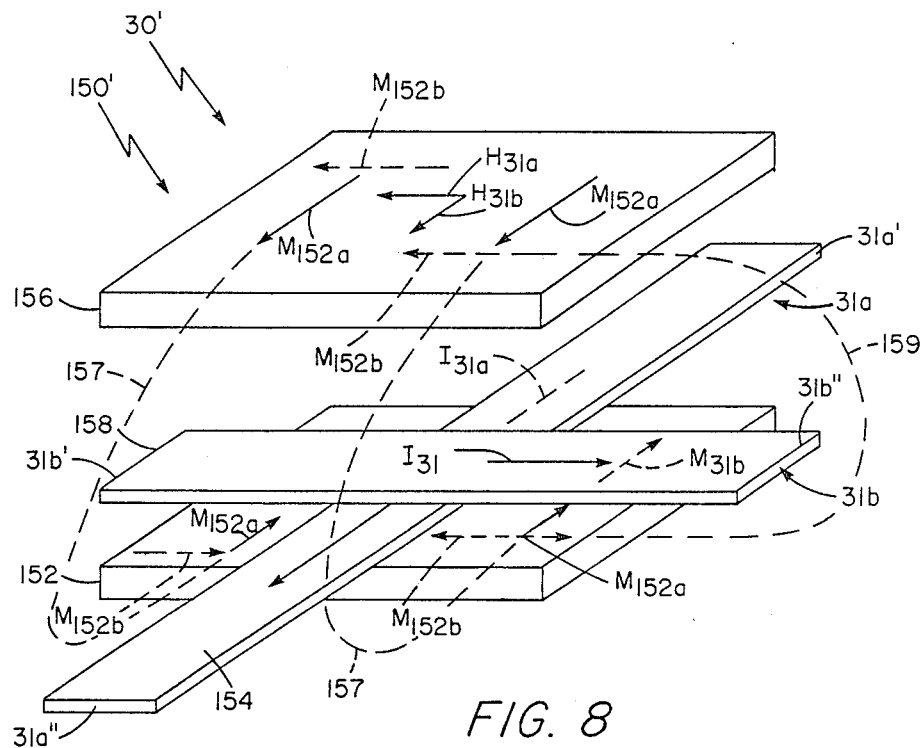
FIG. 8 is an exploded diagrammatical view of a second embodiment of the magnetic storage element for use in the memory element of FIG. 6 including a pair of thin film magnetic layers having mutually orthogonal remanent magnetization states.
Figure 8A:
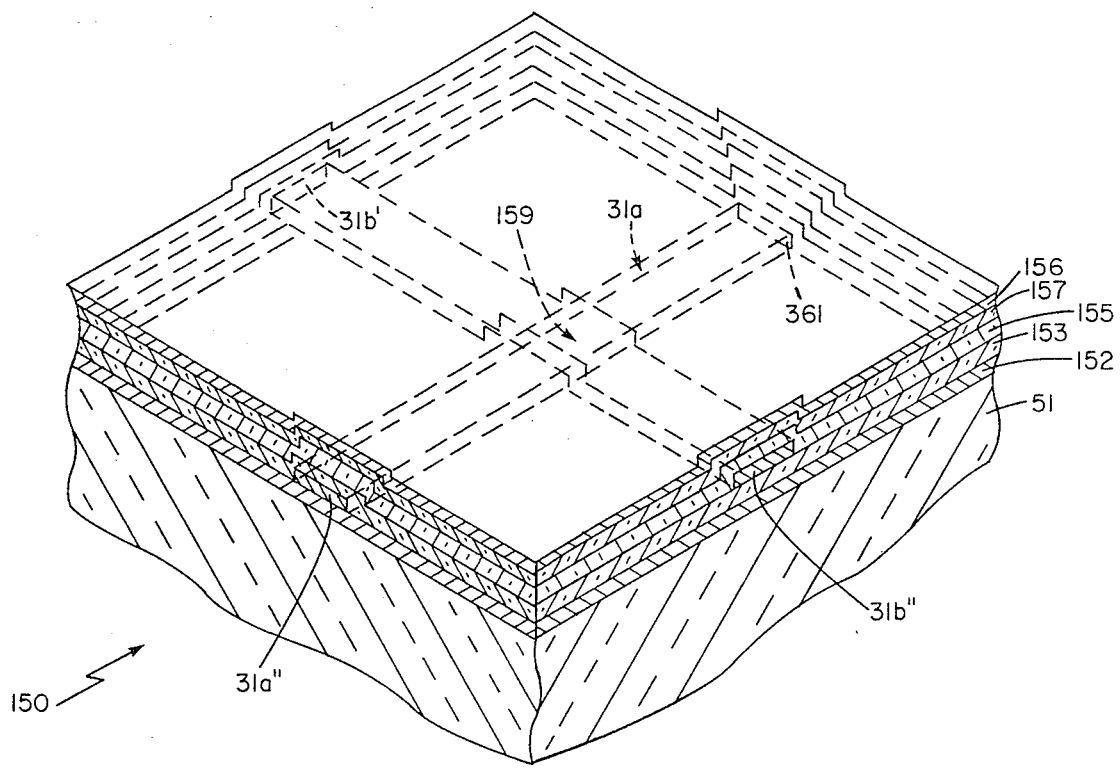
FIG. 8A is an isometric view of the storage element described in FIG. 8, disposed on a substrate.

Referring now to FIGS. 8 and 8A, a second preferred embodiment 150 of a magnetic storage element 30' which overcomes the difficulty encountered by use of high coercivity films is illustrated. In this embodiment 150, a pair of layers 152, 156 comprised of a magnetic material are used as the storage element. Therefore, the substrate 51 has disposed thereover a first magnetic layer 152 and having disposed over the first magnetic layer 152 a first dielectric 153 (FIG. 8A) which electrically isolates a first strip conductor from the magnetic layer 152. A second dielectric 155 (FIG. 8A) is disposed over the first strip conductor 31a to electrically isolate it from a second strip conductor 31b disposed over the first strip conductor and first magnetic layer 152, as shown. A third dielectric layer 157 (FIG. 8A) is disposed over the second strip conductor 31b and the second magnetic layer 156 is then disposed over the second dielectric layer 157 and is thus electrically isolated from the strip conductor 31b. It should also be understood that the layers which are required to isolate the conductors from the magnetic layer need not be used if the adjacent magnetic layer is an electrically insulating material such as a ferrite or a garnet. Since the structure shown in FIGS. 8, 8A has two magnetic layers in close proximity to each other where they are not separated by the conductive strips, the magnetic flux for each one of the desired remanent states can close on itself, as shown by phantom lines 157, 159. Therefore, the remanent states will be stable even when the coercivity of the magnetic material is low. In general, the magnetic layer 152 has the mutually orthogonal remanent states $M_{152a}$, $M_{152b}$ whereas the magnetic layer 156 need only be comprised of a relatively "soft" magnetic material (i.e. has a low coercivity) and merely acts as a high permeability closed flux return path for layer 152.

The magnetic storage element 150 operates with the flip-flop 20 in a similar manner as described in conjunction with FIG. 6 for element 50. Here at least one of the magnetic layers 152, 156 has a pair of mutually orthogonal remanent magnetization states used for information storage. The first remanent state is shown in FIG. 8 as solid arrow $M_{152a}$ on magnetic layer 152 and on magnetic layer 156. Operation of element 150 is, therefore, similar to that of element 50. An interrogating current on line 31a has a direction as shown by arrow $I_{31a}$ and produces a magnetic field $H_{31a}$ orthogonal thereto having a direction as shown on layer 156 (FIG. 8). The magnetic field $H_{31a}$ of the interrogating current $I_{31a}$ is orthogonal to the direction in the remanent states 152a, in magnetic layers 152 and 156. Therefore, the direction of the current is the optimum direction to induce a high frequency response due to domain rotation in the magnetic material. Whereas the direction of the current on conductor 31b as shown by arrow $I_{31b}$ provides a magnetic field $H_{31b}$ which is parallel to the direction of the remanent magnetization moments 152a, in magnetic layers 152 and 156. Therefore, in this direction no response will be induced by the interrogating current. In the second remanent state 152b, the magnetic field $H_{31b}$ from the current $I_{31b}$ on strip conductor 31b will be orthogonal to the directions of the magnetization 152b and, therefore, will provide a maximum response when the magnetic layers 152, 156 are biased to this remanent state.

As shown, the embodiment 150 has a single crossover 159 (FIG. 8A) of the pair of strip conductors 154 and 158. Since, it may be difficult to fabricate the semiconductor components of flip-flop 20 in a precisely, accurate, and balanced manner, it may be difficult to induce sufficient asymmetry in the responses to the currents for both states of the flip-flop circuit 20 by the use of a single crossover magnetic storage element 150.

Figure 9:
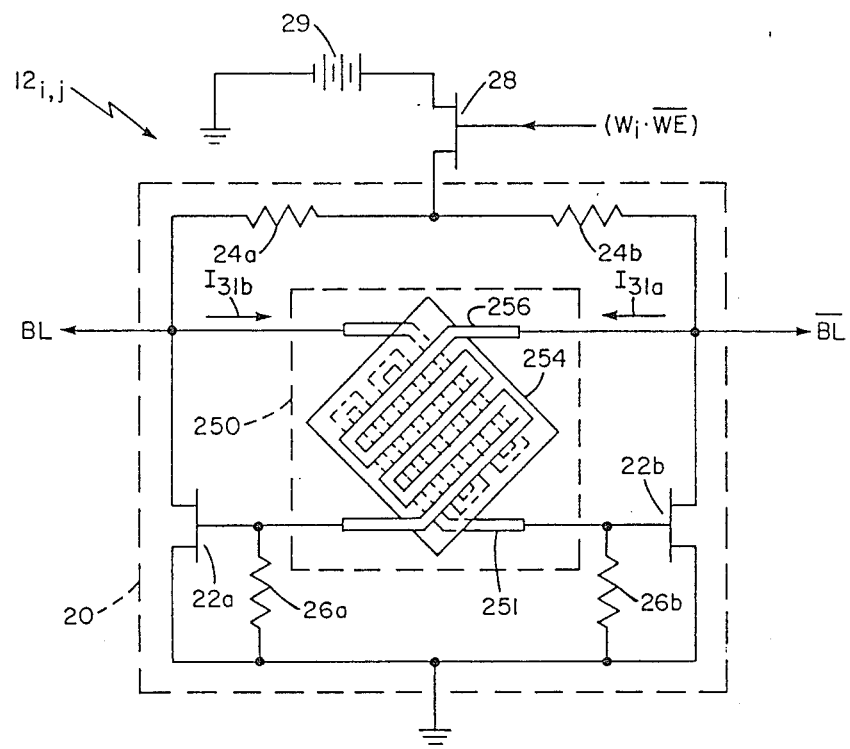
FIG. 9 is a schematic of a further alternate embodiment of a memory cell including a magnetic storage element having mutually orthogonal remanent states in which conductors which couple to said remanent magnetization states have multiple crossovers.

Accordingly, in order to overcome this problem, a storage element with multiple crossovers can be used in place of a storage element with a single crossover, and sufficient asymmetrical response to the currents will be provided by the magnetic storage element permitting proper operation of the flip-flop circuit 20. As shown in FIG. 9, a memory element 250 having a multiple crossover storage configuration is shown. This storage element 250 includes a first conductor 252 disposed on a substrate and spaced from the second conductor 256 by the thin film magnetic layer 254. Again, if the magnetic layer is itself conductive, then the conductors are dielectrically spaced from the magnetic layer 254. Magnetic storage element 250 here has 25 crossovers to provide a sufficient asymmetry in the currents to assure proper operation of the flip-flop circuit.

Figure 10:
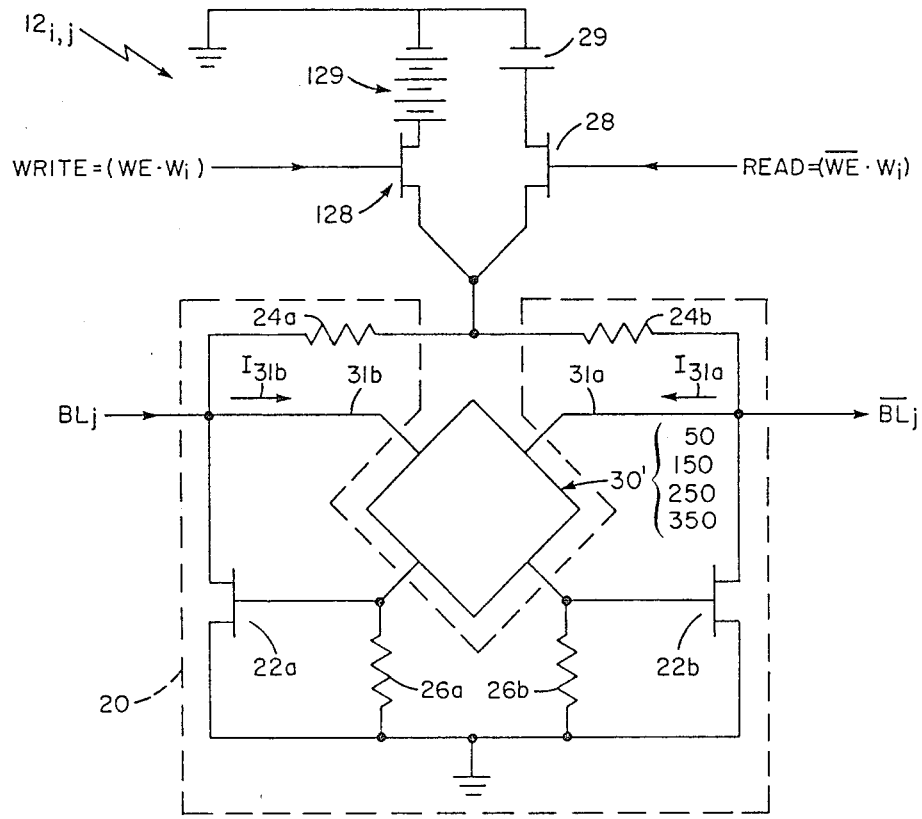
FIG. 10 is a schematic diagram of a memory cell including any of the magnetic storage elements described in conjunction with FIGS. 2-10 showing preferred write circuits.

Referring now to FIG. 10, a preferred embodiment of a memory element $12_{i,j}$ having write circuits which use the same conductors of the magnetic thin film storage device for writing and reading is shown. This circuit includes the same flip-flop circuit 20 as described in conjunction with FIG. 3 having conductors 31a, 31b traversing a memory storage element 30'. Here memory storage element 30' may comprise any of embodiments 50, 150, or 250 as described. Here, however, the element preferably comprises the thin film magnetic storage device 350 as will be described in conjunction with FIGS. 11, 12a–12c, and 13a–13c.

In previous embodiments, separate write conductors were fabricated over the storage element and currents were passed through these conductors via a circuit which received a write enable (WE$_i$) signal, a data signal (Di), and an address signal.

To simplify construction of such a circuit, the same lines used for reading are used for writing information into the magnetic storage element 30'. Here, line BL$_j$ is fed a bias voltage of here $-1$ volt or $+1$ volt, and a transistor 128 is fed a signal (Write) which may be a logic product of a write enable E and the word line signal W$_i$ (i.e. $s = WE \cdot W_i$) to make transistor 128 conduct placing the potential of a source 129 at node 27. When the bias is $-1$ volt, currents will begin to flow through conductors 31a, 31b. Since the voltage across resistor 26a is larger than that across resistor 26b, the current $I_{31b}$ will be larger than current $I_{31a}$ causing transistor 22b to be conductive first which will cause transistor 22a to be non-conductive, thus, writing a logic "0" into element 30'. Conversely, when the bias voltage at line BL is $+1$ volt, current 31a will be larger than current 31b causing transistor 22a to be conductive and transistor 22b to be non-conductive causing a logic "1" to be written in element 30.

Reading for this circuit is similar as before except the "Read" signal is the logical combination of $READ = \overline{WE} \cdot W_i$. Source 129 here 10 volts provides a sufficient current to produce a sufficient magnetic field to overcome the coercivity of the magnetic film in element 30'.

Figure 10A:
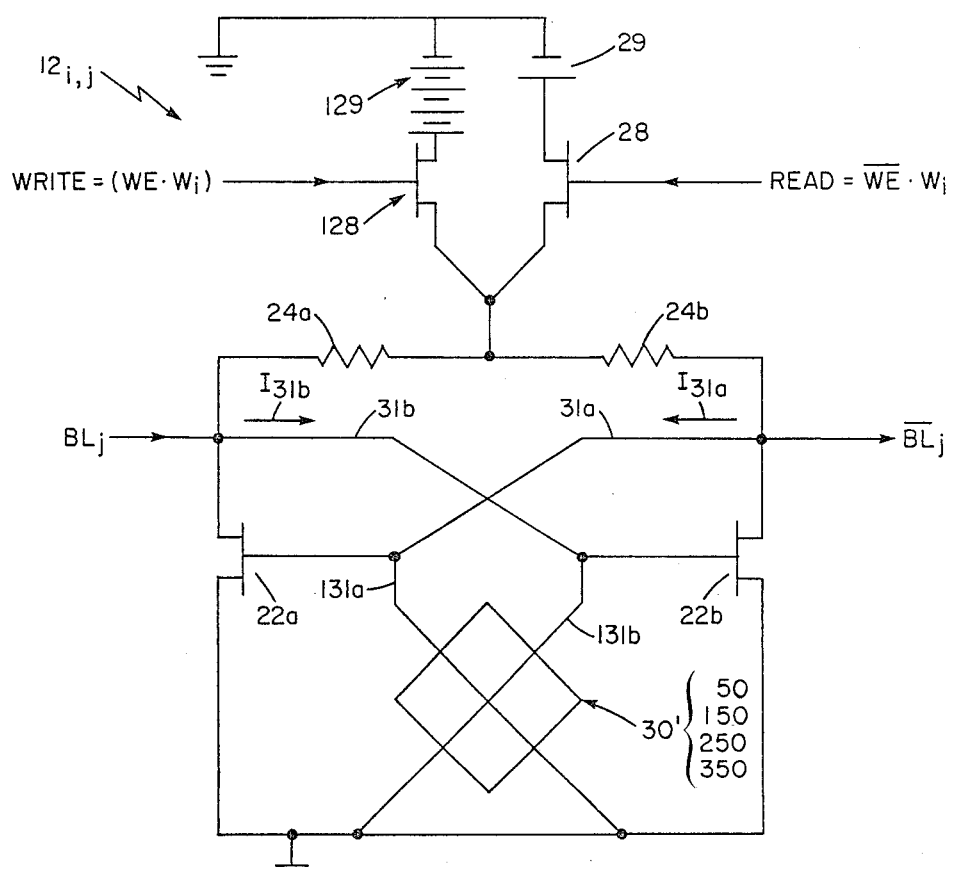
FIGS. 10A, 10B are schematic diagrams of a memory cell including any of the magnetic storage elements described in conjunction with FIGS. 2-10 showing preferred write circuits and alternate locations for the magnetic storage element.
Figure 10B:
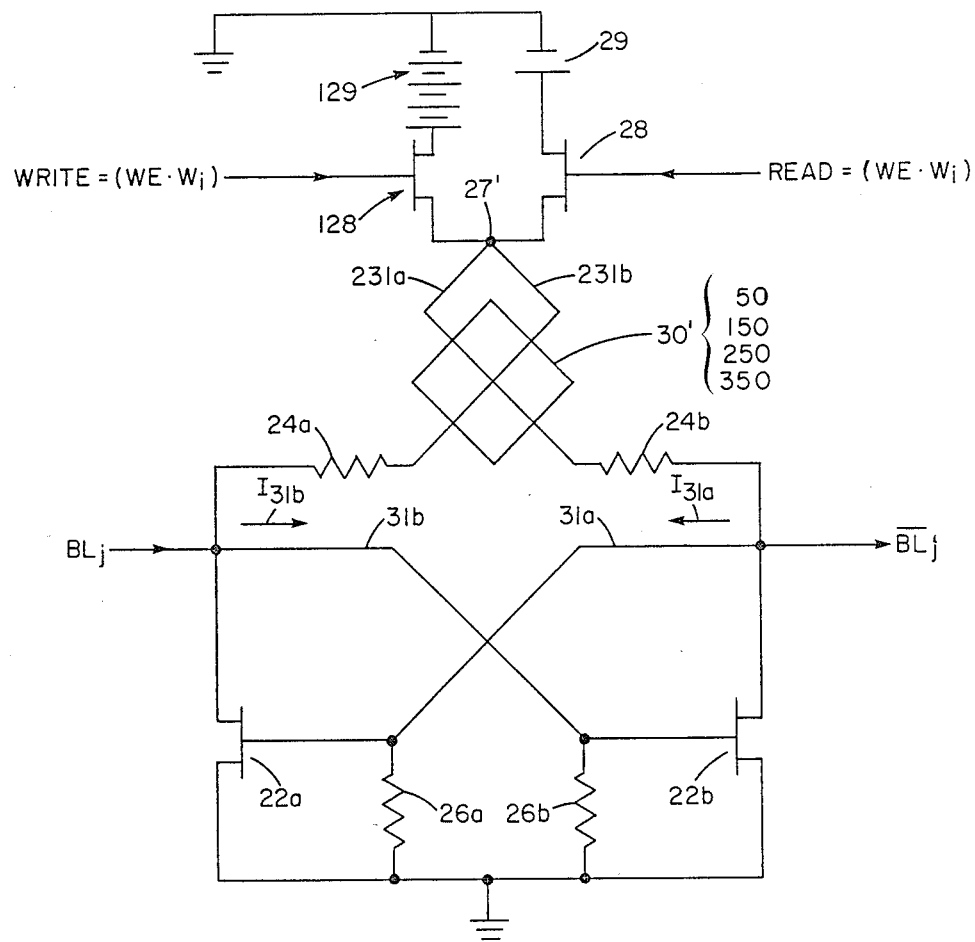

Referring to now to FIGS. 10A and 10B, alternate preferred locations for the magnetic storage element 30' in the memory element $12_{i,j}$ are shown.

Referring first to FIG. 10A, the memory storage element $12_{i,j}$ having write circuits which use the same conductors of the magnetic thin film storage device 30' for writing and reading as generally described in conjunction with FIG. 10 is shown having an alternate location for the magnetic storage element 30'. Accordingly, as shown in FIG. 10A, the magnetic storage element 30' is disposed in the gate bias circuits of the transistors 22a, 22b, and has a pair of conductors 131a, 131b which traverse the magnetic storage element 30' as shown having first ends coupled to ground and having second ends coupled to respective ones of the gate electrodes of transistors 22a, 22b. Accordingly, during interrogation by a read or a write enable signal fed to transistor 28 or 128 respectively, currents $I_{31a}$ and $I_{31b}$ flow through conductors 31a and 31b, and a portion of said currents flow through pads 131a and 131b. In accordance with the orientation of the remanent magnetizations in element 30', one of said currents in said conductors 131a, 131b will be smaller and or delayed with respect to the other one of said currents and provide an asymmetrical response as generally described in conjunction with FIGS. 6–10. Therefore, the magnetic storage element 30' may be used to replace the resistors 26a, 26b (FIG. 10) and as shown in FIG. 10A, or may be used to supplement resistors 26a, 26b (FIG. 10).

Referring now to FIG. 10B, a further alternate location for the magnetic storage element 30' is shown disposed between node 27 and resistors 24a, 24b. Accordingly, conductors 231a, 231b coupled between node 27 and resistors 24a, 24b respectively, traverse element 30' as shown, and again in accordance with the orientation of the remanent magnetization in element 30', one of the currents on conductors 231a, 231b will be smaller and-/or delayed with respect to the current on the other one of said conductors. Accordingly, the respective one of the current portions $I_{31b}$, $I_{31b}$ will be correspondingly delayed or smaller at the gates of transistors 22a, 22b inducing an asymmetrical response by the flip-flop, as generally described in conjunction with FIGS. 6–10.

Figure 12:
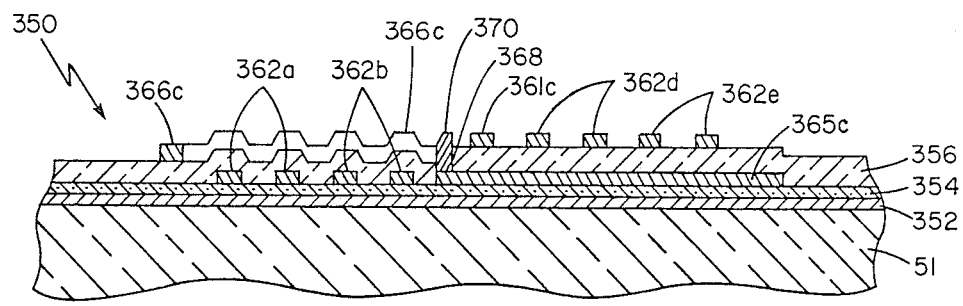
FIG. 12 is a cross-sectional view taken along lines 12—12 of FIG. 11.
Figure 11:
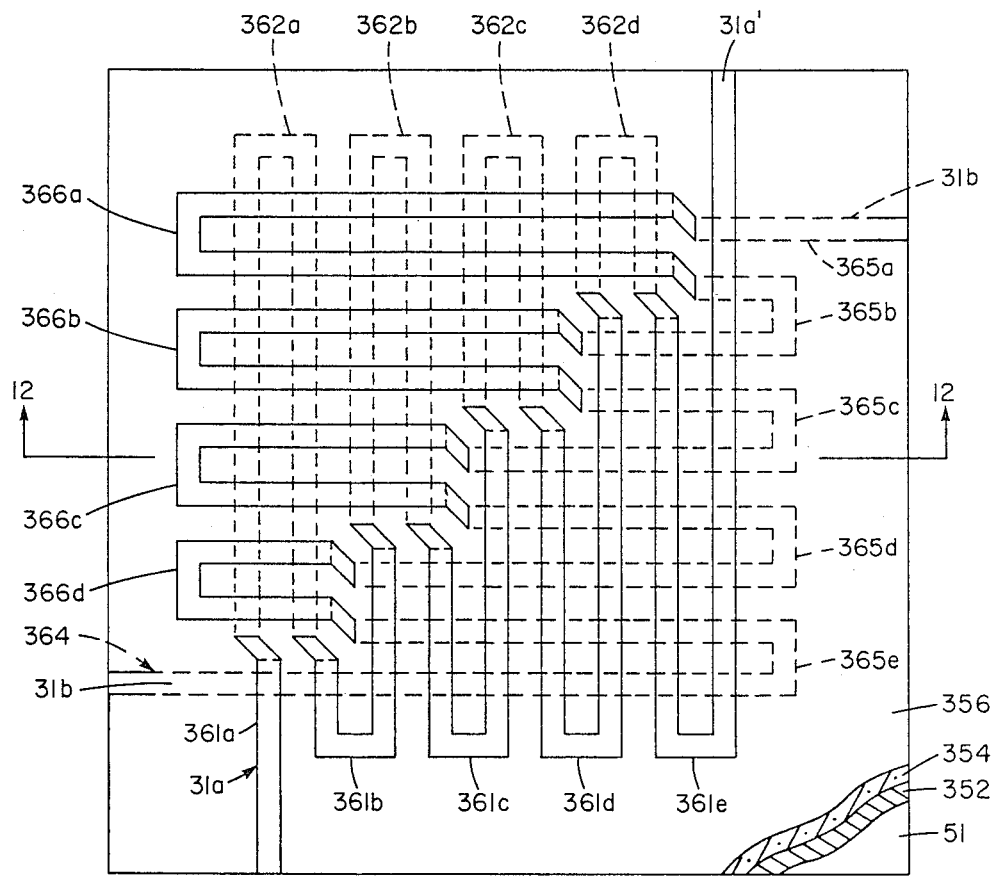
FIG. 11 is a plan view of a preferred magnetic storage element for circuits described in conjunction with FIGS. 6 and 10 having a single magnetic layer and symmetrical conductor pairs with multiple crossovers.

Referring now to FIGS. 11–13, fabrication of the magnetic thin film storage element 350 will be descried. Referring first to FIGS. 11 and 12, the magnetic storage element 350 is shown disposed on a portion of a substrate 51, again substrate 51 may comprise a suitable semiconductor material such as silicon or gallium arsenide which supports the circuit elements comprising the flip-flop 20 write circuits etc., as previously described. Disposed over a first surface of substrate 51 is a single crystalline thin film layer of a magnetic material 352, here preferably an oriented iron (Fe) layer, as will be described. Disposed over said magnetic material layer 352 is a insulating layer 354, here comprised of a suitable insulator such as silicon dioxide. Disposed over the first insulating layer 354 is a first portion of the patterned strip conductor segments 362a-362d, 365a-365e to form patterned bi-level conductors 31a, 31b. Disposed over these strip conductor segments 362a-362d, 365a-365e is a second dielectric layer 356 here also comprising a material such as silicon dioxide (SiO₂). Disposed over the second insulating layer 356 is strip conductor segment 366c having a portion thereof disposed in the cross-sectional view of the FIG. 11 and strip conductor segments 361c, 362d, and 362e as shown. Strip conductor segment portion 366c disposed over the second insulating layer 356 is electrically connected to strip conductor portion 365c disposed on the first insulating layer 352 through a plated via hole 370 having a plated deposit 368 provided therein as shown in FIG. 11. As in FIG. 11, the strip conductor generally denoted as 31a has a first portion of strip conductor segments 361a-361e disposed at a first level over the magnetic thin film layer 352, and a second portion of strip conductor segments 362a-362d disposed at a second, different level from the magnetic thin film layer 352. Similarly, the strip conductor generally denoted as 31b has a first plurality of strip conductor segments disposed at a first level 365a-365e, and a second plurality of strip conductor segments 366a-366d disposed at a second different level from the magnetic thin film layer 352. Accordingly, strip conductor segments 31a and 31b provide a balanced, symmetrical configuration with the magnetic thin film layer 352 while permitting the magnetic thin film layer to be deposited directly on the substrate 51 in a manner to be described.

Figure 13A:
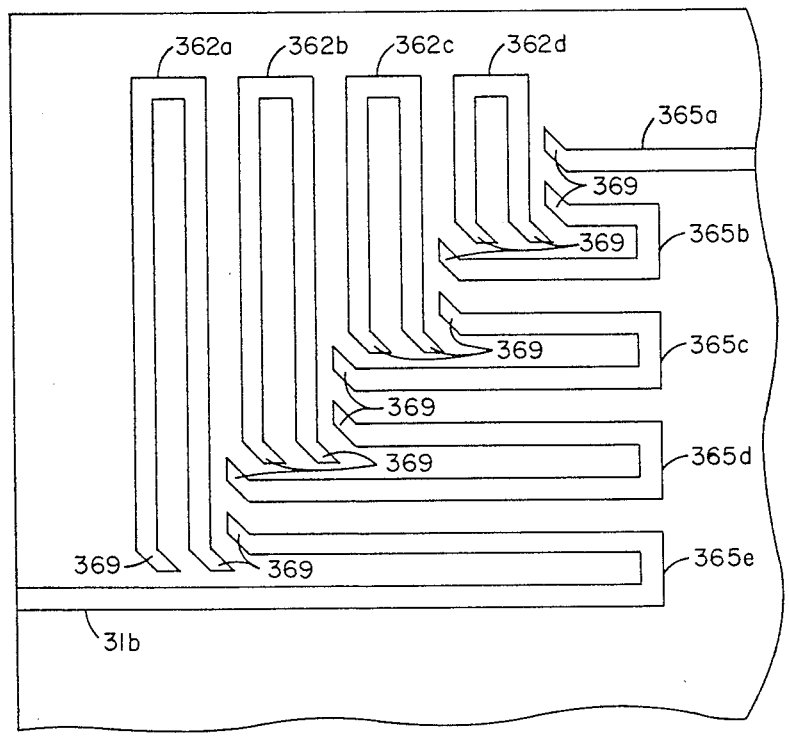
FIGS. 13A-13C are series of plan views showing a preferred arrangement of conductor patterns for the magnetic thin film storage element shown in FIG. 11.
Figure 13B:
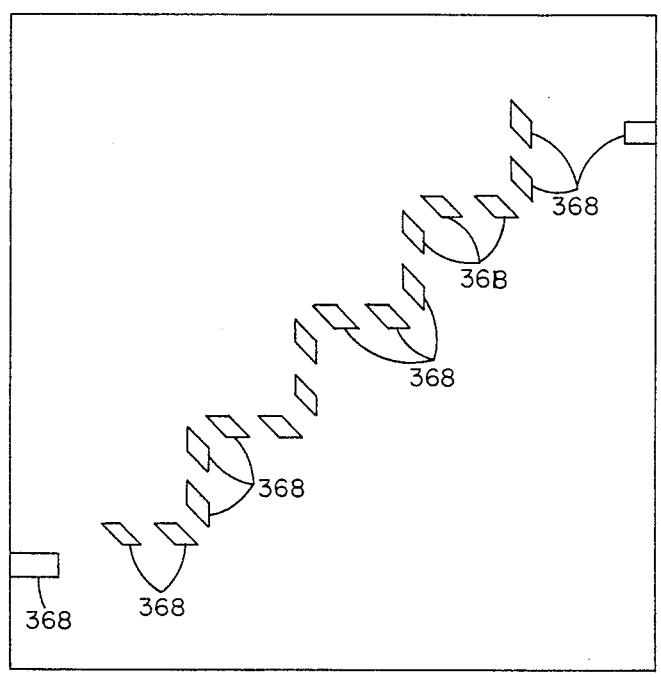
Figure 13C:
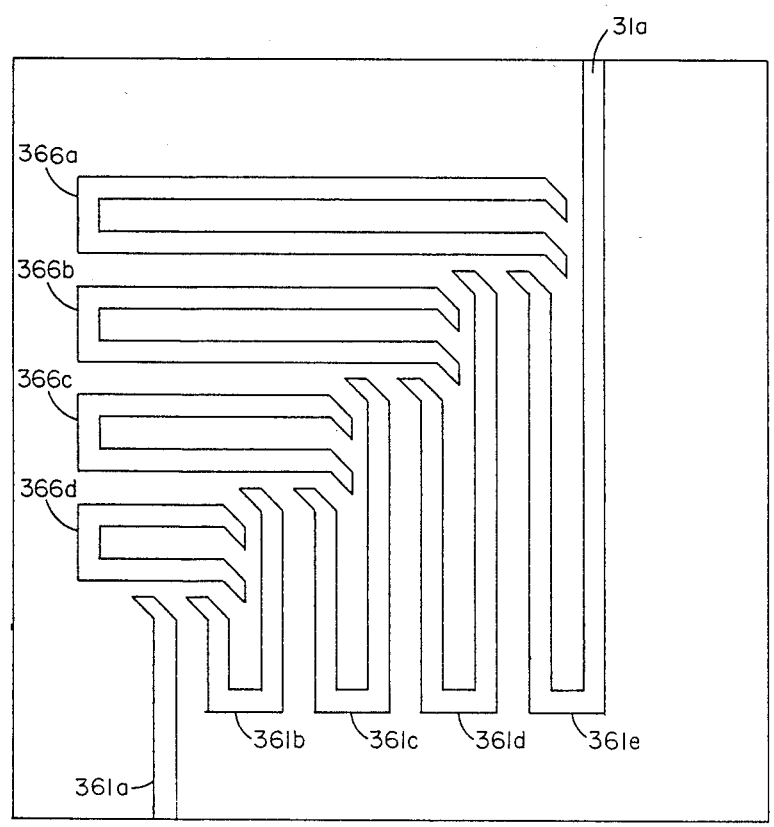

Preferred patterned conductors to form this arrangement of strip conductors are shown in the plan views of FIGS. 13A-13C. FIG. 13A shows a plan view of the bottom strip conductor portions 362a-362d and 365a-365e. FIG. 13B shows a pattern to open apertures 368 in dielectric layer 354, to expose end portions 369 of the bottom strip conductors 362a, 362d and 365a-365e, as shown. FIG. 13C shows the top strip conductors 31a, 361a-361e and 366a-366d which connect to the bottom strip conductors 31b, 365a-365e and 362a-362d, through the apertures using conventional techniques, as shown for example in U.S. Pat. No. 4,532,484.

Figure 12A:
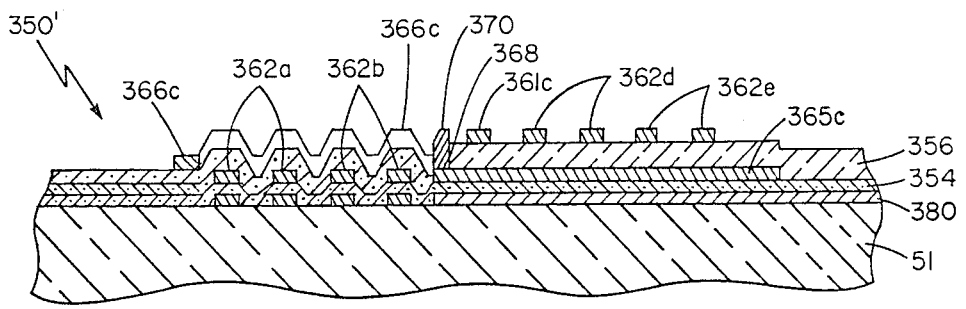
FIG. 12A is a cross-sectional view of an alternate arrangement for the patterned conductors and magnetic layer for the magnetic storage element of FIG. 11.

Referring now to FIG. 12A, an alternate structure for the magnetic storage element 350' is shown to include a patterned magnetic layer 380 disposed on substrate 51. The patterned magnetic layer 380 has a pair of mutually orthogonal remanent magnetization states as shown in FIG. 12 but exist only in regions of the element 350 where the bottom strip conductors cross over the upper strip conductors. Patterned magnetic layer 380 may be provided by growing the magnetic material in a manner as will be described subsequently through patterned mask regions, or alternatively may be provided by etching the magnetic layer after growth or deposition of the layer, as will be described. That is, preferably the magnetic layer 380 may be patterned to follow the lower strip conductor portions 362a-362d and 365a-365e, as generally shown in conjunction with FIG. 12A.

Figure 12B:
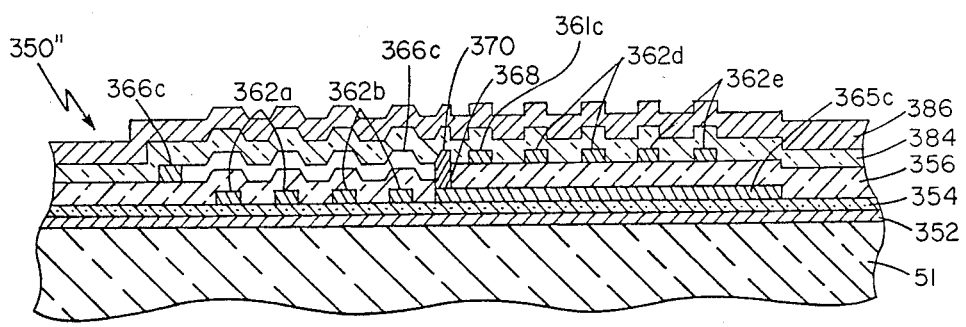
FIG. 12B is a cross-sectional view of a further alternate arrangement for the patterned conductor and magnetic layer for the magnetic storage element of FIG. 11.

Referring to FIG. 12B, a further alternate embodiment of the magnetic storage element 350" is here shown to include a second magnetic layer 382 disposed over the arrangement, as generally described in conjunction with FIG. 12 to provide a high permeability closed flux return path for the magnetic layer 352. The second magnetic layer accordingly is spaced from the upper strip conductors by a third insulating layer 386, as shown.

One technique to provide a suitable magnetic thin film for the embodiments of FIGS. 2-5 is to deposit the film in the presence of a magnetic field to induce an anisotropy in the magnetic film. This so-called "induced anisotropy" allows the magnetic film to be magnetized significantly easier in a direction parallel or antiparallel to the direction of the initially present or applied magnetic field, than in a direction perpendicular or orthogonal to the direction of initially the applied magnetic field. For the embodiments shown in FIGS. 2-5, the magnetic films 72a, 72b, are deposited in the presence of a magnetic field which is parallel or antiparallel to the direction of the pair of opposing remanent magnetization states.

Two techniques will be described to provide a magnetic layer film suitable for the embodiments described in conjunction with FIGS. 6-13. The first technique will be described in conjunction with FIGS. 14-17, the second technique will be described in conjunction with FIGS. 18-23.

As previously mentioned, the preferred arrangement of the magnetic thin film material is as a magnetic material having a pair of remanent states which are mutually orthogonal as the states used for information storage.

To provide a magnetic layer, for the embodiments shown in FIG. 6 to 10, bi-axial anisotropy must be induced, and thus the magnetic layer must have a first portion deposited in the presence of a magnetic field along a first direction, and a second portion deposited in the presence of a magnetic field disposed orthogonal to the initial direction of the field. Therefore, in this arrangement remanent orthogonal states are induced into the magnetic material, and the magnetic material is easy to magnetize in a direction parallel to one of the aforementioned remanent states and difficult to magnetize in a direction orthogonal to one of the aforementioned remanent states. For the purpose of stabilizing the remanent states with mutually orthogonal magnetization directions, 4-fold symmetry, that is bi-axial anisotropy is required. The bi-axial anisotropy is here induced in a single magnetic layer 154, 254, and 354 by depositing half of the magnetic layer in a magnetic field of one orientation and the other half in a magnetic field having an orthogonal orientation. The easy axes of the resulting bi-axial anisotropic layer 154, 254, and 354 will then be at a 45° to the direction in which the fields were applied during deposition, as illustrated in FIG. 14.

Figure 14:
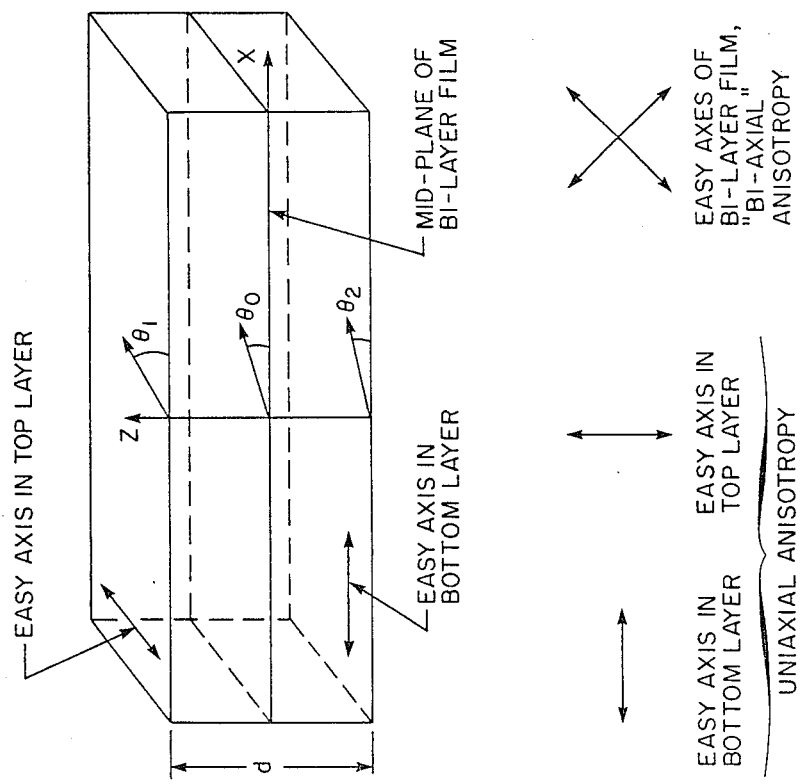
FIG. 14 is an isometric view of a model of a bi-layer magnetic film having induced bi-axial anisotropy.

In a theoretical analysis of bi-axial anisotropic layer 254 as shown in FIG. 14, it is appropriate to consider the magnetic energy density of the material comprising the film. Significant contributions to this energy density arise from the local uni-axial anisotropy and from the so-called exchange interaction. The local direction of the magnetization vector may be characterized by an angle $\theta$ as shown in FIG. 14. The magnetization lies within the plane of the film and includes the angle $\theta$ with respect to the X-axis, $\theta$ being a function of the direction Z. Its value at the top and bottom surfaces is denoted as $\theta_1$ and $\theta_2$ respectively. For the configuration shown in FIG. 11, the energy density $\epsilon$ is $$\epsilon = K_u \cos^2\theta + A(d\theta/dz)^2 \quad \text{for } 0 < z < d/2 \quad (2)$$
$$\epsilon = K_u \sin^2\theta + A(d\theta/dz)^2 \quad \text{for } -d/2 < z < 0.$$

Here $K_u$ is a constant that characterizes the strength of the local uni-axial anistropy and A a constant that characterizes the strength of the exchange interaction. For permalloy, $K_u \simeq 5 \times 10^3$ erg/cm$^3$ and $A \simeq 10^{-6}$ erg/cm. The stable magnetization profile $\theta(z)$ can be found from (2) by minimizing the energy per unit area $$E = \int_{-d/2}^{+d/2} \epsilon(\theta, d\theta/dz) dz. \quad (3)$$

The condition for an extreme of the energy leads to the differential equation, $$\frac{\partial}{\partial \theta} - \frac{\partial}{\partial z}\left(\frac{\partial}{\partial(d\theta/dz)}\right) = 0 \quad (4)$$

or, in the present case, using (4)

$$(A/K_u)\partial^2\theta/\partial z^2 + \cos\theta\sin\theta = 0 \quad \text{for } 0 < z < d/2 \quad (5)$$
$$(A/K_u)\partial^2\theta/\partial z^2 - \cos\theta\sin\theta = 0 \quad \text{for } -d/2 < z < 0.$$

It is convenient to introduce a reduced z-scale and define $\tilde{z} = z \cdot \sqrt{K_u/A}$, $\tilde{d} = \sqrt{K_u/A}$ (reduced film thickness). Equation (7) can then be written as $$\theta'' \pm \cos\theta \sin\theta = 0$$

where the prime denotes differentiation with respect to z. The upper and lower signs correspond to $\tilde{z} > 0$ and $\tilde{z} < 0$ respectively.

For $\tilde{z} > 0$, Eq. (8) can be integrated by noting that it is equivalent to $$(\theta'^2 + \sin^2\theta)' = 0$$

which implies that $$\theta'^2 + \sin^2\theta = \text{const.} \quad (6)$$

Since $\theta'$ has to vanish at both film surfaces the constant on the right hand side of (6) must equal $\sin^2\theta_1$, where $\theta_1 = \theta(\tilde{d}/2)$. Eq. (6) can therefore be written as $$\frac{dz}{d\theta} = \frac{1}{\sqrt{\sin^2\theta_1 - \sin^2\theta}} \quad (7)$$

and the solution $\tilde{z}(\theta)$ can be expressed in terms of elliptic integrals of the first kind as $$\tilde{z}(\theta) = \frac{1}{\sin\theta_1}\left[F\left(\theta\left|\frac{1}{\sin^2\theta_1}\right.\right) - F\left(\theta_o\left|\frac{1}{\sin^2\theta_1}\right.\right)\right]. \quad (8)$$

Here $\theta_o$ is $\theta(\tilde{z}=0)$ and the modulus of the elliptic integrals is $1/\sin^2\theta_1$, i.e., $>1$. By using well-known relationships between elliptic integrals the solution can also be expressed as $$\tilde{z}(\theta) = F(\psi_1|\sin^2\theta_1) - F(\psi_{1o}|\sin^2\theta_1) \quad (9)$$

where $$\sin\psi_1 = \sin\theta/\sin\theta_1 \quad (10)$$
$$\sin\psi_{1o} = \sin\theta_o/\sin\theta_1$$

and the modulus ($\sin^2\theta_1$) is now $<1$.

A complete solution $\theta(\tilde{z})$ can be constructed from Eq. (9) and a complementary equation for $\tilde{z} < 0$, noting that $\theta(\tilde{z})$ and $\theta'(\tilde{z})$ must be continuous at $\tilde{z} = 0$, whereas $\theta''(\tilde{z})$ is discontinuous at $\tilde{z} = 0$.

Figure 15:
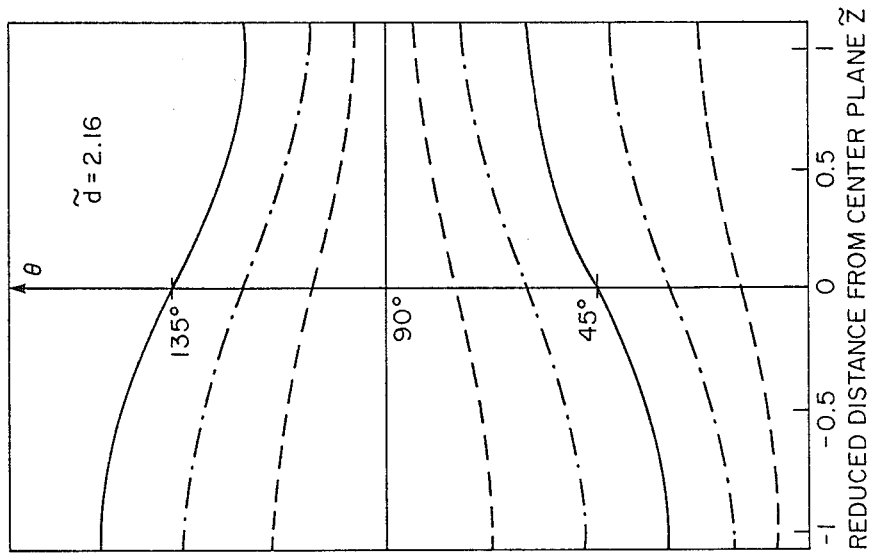
FIG. 15 is a plot of the angle between local magnetization direction and X-axis as a function of reduced distance from a center plane of the bi-axial film of FIG. 14.

FIG. 15 illustrates the solution $\theta(\tilde{z})$ as derived from (9) for a case in which the reduced film thickness has an intermediate value ($\tilde{d} = 2.16$). The various curves correspond to different values of $\theta_o$. Since the X-axis ($\theta = 0$, 180°) is the easy axis for $z < 0$ and the y-axis ($\theta = 90°$) the easy axis for $z > 0$ the solution curves $\theta(z)$ are pulled towards $\theta = 0$ for $z > 0$ and towards $\theta = 90°$ for $z > 0$.

Figure 16:
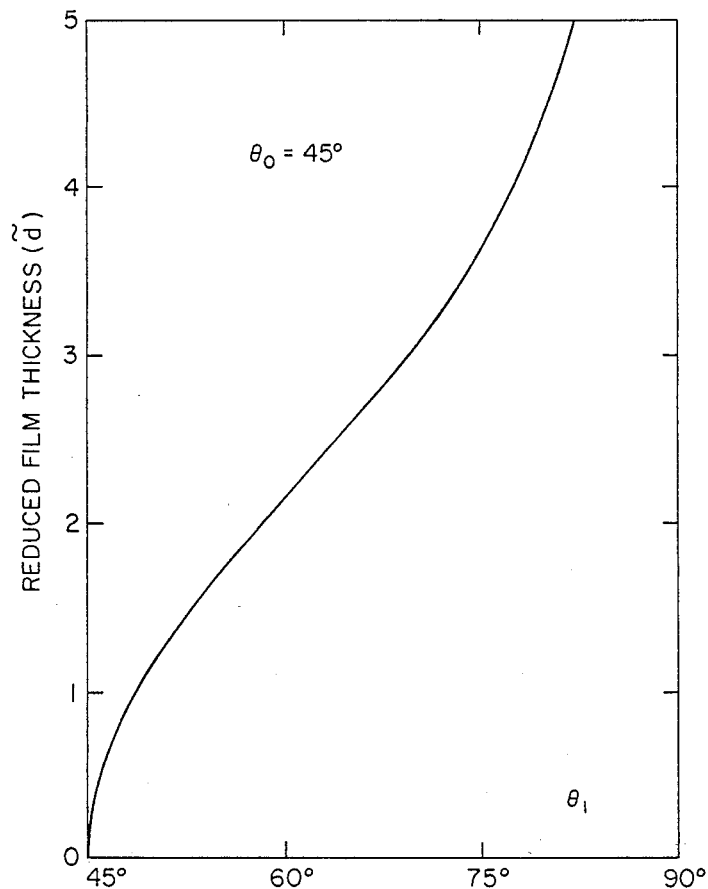
FIG. 16 is a plot of reduced film thickness as a function of magnetization angle at the top surface of the film of FIG. 14.

The dependence of the magnetization angle at the surface $\theta_1$ on reduced film thickness $\tilde{d}$ is illustrated in FIG. 16 for the case in which $\theta_o = 45°$. The reduced film thickness of 2.16 assumed in FIG. 15 corresponds to $\theta_1 = 60°$ and $\theta_2 = 30°$.

With the functional dependence of $\theta$ on $\tilde{z}$ determined it is relatively easy to calculate the total energy for given $\theta_o$ as a function of the reduced film thickness. The cases $\theta_o = 0°$ and $45°$ are of particular interest because from symmetry considerations these cases correspond to extreme of the total magnetic energy. For $\theta_o = 0$, $\theta(z)$ is constant; thus the exchange energy vanishes and the total energy is independent of film thickness.

For the case $\theta_o = 45°$ the solution satisfies the symmetry condition $$\theta(\tilde{z}) - \theta_o = -[\theta(-\tilde{z}) - \theta_o]. \quad (11)$$

The calculation of total energy therefore only requires the solution $\theta(\tilde{z})$ for $z > 0$. The energy per unit area is 2 times the energy contributed by the upper half of the film and according to (2) and (3)

$$E = 2 K_u \int_o^{\tilde{d}/2} (\cos^2\theta + \theta'^2) dz \cdot \sqrt{\frac{A}{K_u}} = \quad (12)$$
$$2\sqrt{AK_u} \int_o^{\tilde{d}/2} (\cos^2\theta - \sin^2\theta + \sin^2\theta_1) dz$$

where Eq. (6) has been used. The remaining integral can be expressed in terms of elliptic integrals of the first and second kind with the result $$E = 2\sqrt{AK_u} \cdot \{-\cos^2\theta_1 [F((\pi/2)|\theta_1 - F(\psi_{1o}|\theta_1)] + \quad (13)$$
$$2[E((\pi/2)|\theta_1) - E(\psi_{1o}|\theta_1)]$$

$\psi_{1o}$ with given by (10).

For comparison with other energies it is more convenient to consider the average energy per unit volume $\langle\epsilon\rangle$ $$\langle\epsilon\rangle = E/d = E/(A/K_u \tilde{d}). \quad (4)$$

Combining (13) and (14) one obtains $$\langle\epsilon\rangle = 2 K_u \{-\cos^2\theta_1 [F((\pi/2)|\theta_1 - F(\psi_{1o}|\theta_1)] - \quad (15)$$

-continued $$2[E((\pi/2)|\theta_1) - E(\psi_{1o}|\theta_1)]\}/\tilde{d}.$$

Figure 17:
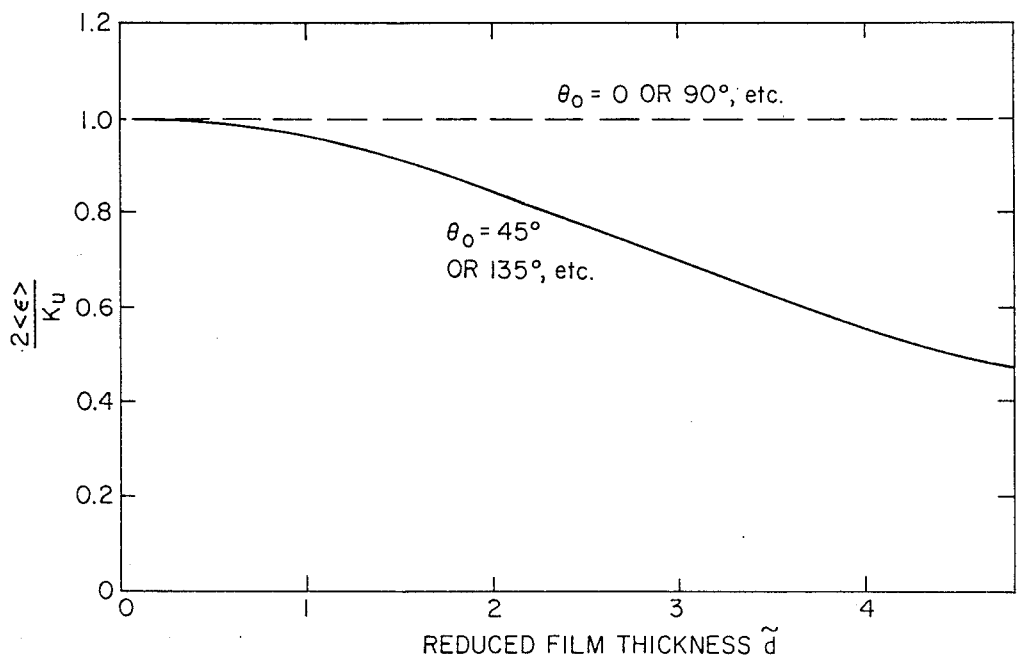
FIG. 17 is a plot of average energy density versus reduced film thickness for the bi-axial film of FIG. 14.

In FIG. 17 the quantity $\tilde{2}<\epsilon>/K_u$ is plotted versus reduced film thickness d, for $\theta_o=0$ (or equivalent angles) and $\theta_o=45°$ (or equivalent angles). For $\theta_o=0$ the energy is independent of film thickness as previously pointed out. In the limit $\tilde{d}\rightarrow 0$, the energy applicable for $\theta_o=0$ approaches that for $\theta_o=45°$. For finite $\tilde{d}$ the energy is smaller for $\theta_o=45°$ than for $\theta_o=0$. This implies that the easy axes of the induced bi-axial anisotropy are at 45° to the directions of the fields present during film deposition, as previously pointed out in connection with FIG. 17. The difference between the curve calculated for $\theta_o=45°$ and the straight line applicable for $\theta_o=0$ is a measure of the strength of the bi-axial anisotropy.

A second preferred material, however, for providing the magnetic thin film material is an epitaxially grown single crystalline Fe film particularly on (100) faces of gallium arsenide misaligned 2° within ±0.5° towards the nearest <110> axis.

Figure 18:
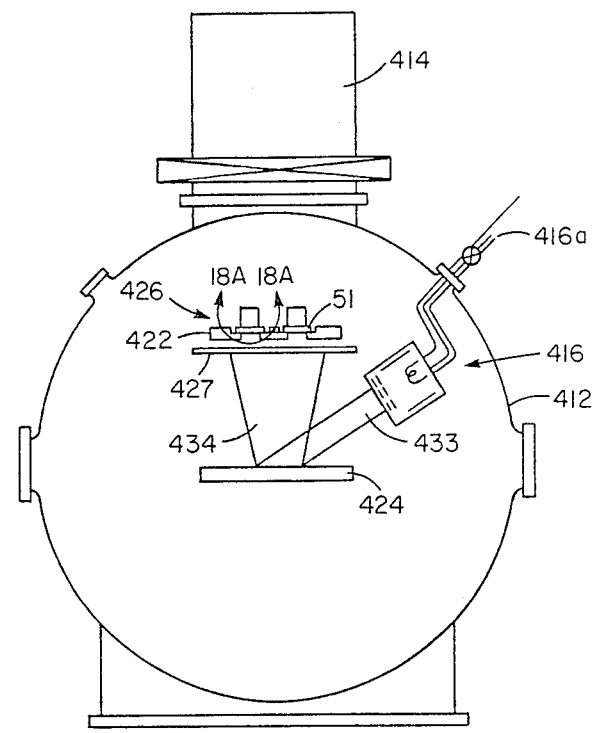
FIG. 18 is a schematic representation of an ion beam sputterer used to grow a natural anisotropic magnetic layer in particular for the element of FIG. 11.
Figure 18A:
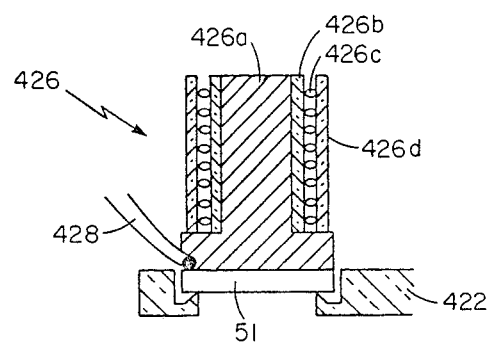
FIG. 18A is an enlarged view taken along line 18A—18A of FIG. 18 showing details of the substrate heater for the apparatus shown in FIG. 18.

Referring now to FIGS. 18, 18A an ion beam sputtering system 410 used for epitaxially growing a thin metal film 352 here an iron (Fe) film having natural bi-axial anisotropy, over (100) crystal face of the substrate 51 (FIGS. 11, 12-12B) comprised of gallium arsenide (GaAs), is shown to include an ultra-high vacuum chamber 412 and a cyrogenic pump 414 used to evacuate the vessel to provide an internal atmospheric pressure of about $10^{-9}$ torr. An ion gun 416 here of a broad beam width type is disposed within the chamber 412 and is fed via an inlet port 416a with a suitable ion source such as argon gas or other ones of the inert gases, as shown. The substrate 51 is mounted in a holder 422 disposed opposite a target 424 here comprised of Fe. Target 424 here has a thickness typically in the range 0.0625 to 0.125" although other thicknesses may also be used. A removable shutter 427 is interposed between the mounted substrate 51 and the target 424. Referring now also to FIG. 18A, the temperature of substrate 51 is controlled by a heater assembly 426 comprising a thermally conductive block member 426a, an insulator 426b, spacing a heater coil 426c, and a glass shield 426d disposed to protect the heater coil 426a, as shown. A thermocouple 428 is embedded between the block 426a and the substrate 51 to sense the temperature of substrate 51 and thus to provide and to control the temperature of the substrate 51 within predetermined temperature limits.

In operation, one or more substrates 51 are disposed in the holder 422 behind the shutter 427, as shown. The vessel is evacuated to provide an internal pressure of at least $5\times 10^{-8}$ torr. After this vacuum at least has been provided, the vessel is backfilled with an inert gas here argon to a pressure in the range of $8\times 5^{-5}$ torr to $1\times 10^{-4}$ torr. Generally, the gas which is used to backfill the vessel is the same gas which is used to provide ion species in a manner to be described. The shutter 427 is normally in the close position, thereby shielding the substrates 51 from the target 424. Prior to epitaxial growth of the layer 352 (FIG. 11, FIGS. 12-12B) over the substrates 51, the substrate 51 is disposed at a predetermined temperature typically here in the range of 215° C. to 355° C. After substrate 51 has been allowed to achieve this temperature, the ion specie gas, here argon, is directed to gas inlet 416a and is fed into the ion gun 416. Emerging from ion gun 416 are accelerated ions of here argon (Ar+) 433 which are directed towards the target 424 and strike an area of the target 424 roughly opposite the substrate 51, as shown. However, at this juncture, the shutter 427 is in its closed position shielding the substrate from the target 424, therefore, the ions strike target 424 and provide a coating of iron on the shutter 427. This predeposit of the Fe on the shutter 427 enables the iron to act as a getter for any free oxygen ($O_2$) remaining in the chamber 412. This will provide epitaxial Fe layers over the substrate having very low concentrations of oxygen within the layers.

After this pregrowth operation, Ar is again let into the ion gun 414 and Ar ions emerge from the gun having electron energies typically in the range of 500 to 2,000 electron volts, which strike the target in region thereof again opposite the substrate 51. Provided as a result of these collisions with atoms of the target 424 are Fe atoms which sputter off the target 424 having electron energies between about 1 electron volt and 100 electron volts (eV) with a substantial number of those atoms having electron energies within in the range of about 10 eV to 20 eV. These atoms are directed in various directions but principally towards the substrate 51 in the manner as shown by the fan beam 434. The metal atoms accordingly have high kinetic energy which enhances the surface diffusion energy of the atoms on the substrate 51. This accordingly allows the Fe atoms to be deposited on proper lattice positions and provides a single crystal (100) Fe layer over the (100) substrate.

With the substrate 51 orientated in a {100} family of planes, the iron layer deposited over the substrate will be likewise orientated in a {100} family of planes and will have a pair of directions <010> and <001> disposed in a common plane on the surface of the substrate. This will provide a layer 352 (FIGS. 11, 12-12B) having a natural bi-axial anisotropy.

The ion beam sputtering apparatus 410 has several advantages over other conventional sputtering and growth techniques for producing epitaxial films of metal layers particularly over (100) faces of semiconductor materials such as gallium arsenide. The most important advantages is that the iron atoms are provided with high kinetic energies in a relatively low pressure, low temperature environment. This allows the Fe atoms to have a long mean free path enabling the Fe atoms to have high surface diffusion energy and, therefore, allow the iron atoms to deposit at proper lattice sites as the Fe film is grown even at low substrate temperatures. That is, the high kinetic energies lead to a high surface diffusion energy even at low substrate temperatures which is a favorable condition for epitaxial growth. Low substrate temperatures have a further advantage particularly for materials such as gallium arsenide where high temperatures can lead to decomposition of the gallium arsenide. Furthermore, since the Fe film will have different thermal expansion properties than the gallium arsenide, lower temperature deposition with high kinetic energy will reduce crystal strain caused by mismatch in the thermal expansion properties of both materials.

Further, the Fe film deposited in this manner on the (100) gallium arsenide substrate has a so-called natural anisotropy or bi-axial anisotropy. Iron has a body centered cubic structure whereas gallium arsenide has a cubic structure known as the "zinc blended" structure and has a lattice constant which is very nearly twice that of iron, providing a sufficiently close lattice match of the Fe film to gallium arsenide. Depositing the Fe film on the (100) surface of the gallium arsenide will provide the (100) surface of the Fe film in a perpendicular nonplanar axes to the gallium arsenide surface, and the <010> directions and <001> directions of the Fe cubic structure in mutually orthogonal, directions disposed in the same plane to the surface of the gallium arsenide.

Accordingly, the <010> and <001> directions of the Fe crystal may be used as remanent magnetization states to provide an Fe magnetic thin film material and having a pair of mutually orthogonal remanent magnetization states.

Figure 19:
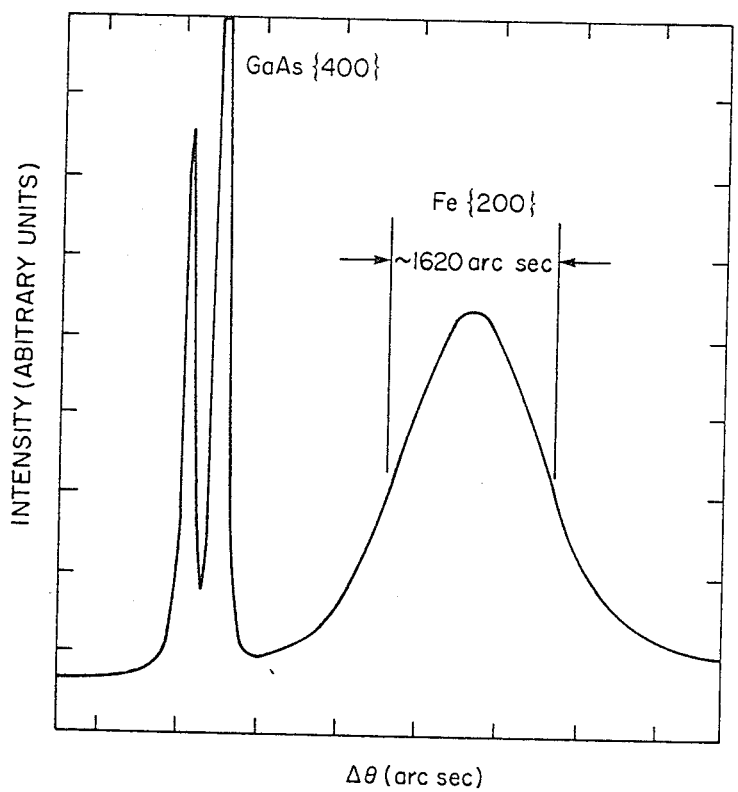
FIG. 19 is a plot of x-ray intensity versus the diffraction angle for a film grown as described in conjunction with FIG. 18.

The single crystal character of the Fe films have been shown by means of x-ray and magnetic measurements. Referring to FIG. 19, an x-ray rocking curve obtained on a film having a thickness of 570 nanometers is shown. The presence of a single Fe {200} peak confirms the single crystal nature of the film.

Figure 20:
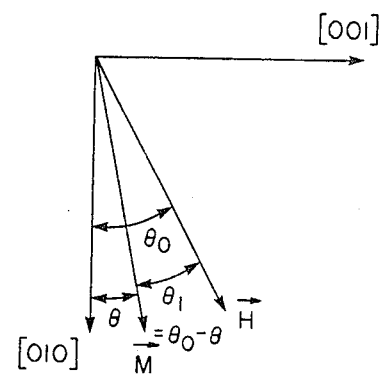
FIG. 20 is a vector diagram which defines the relationship of angles that characterized the orientation of magnetization and magnetic field for the film grown as described in conjunction with FIG. 18.
Figure 21:
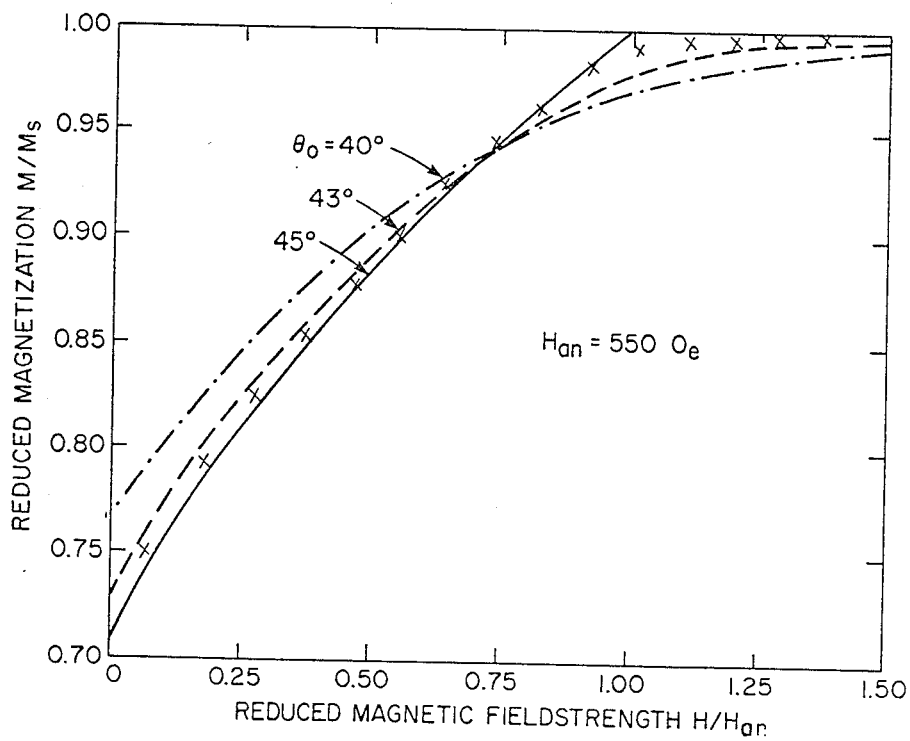
FIG. 21 is a plot of reduced magnetization versus reduced field strength for a film grown as described in conjunction with FIG. 18.
Figure 22:
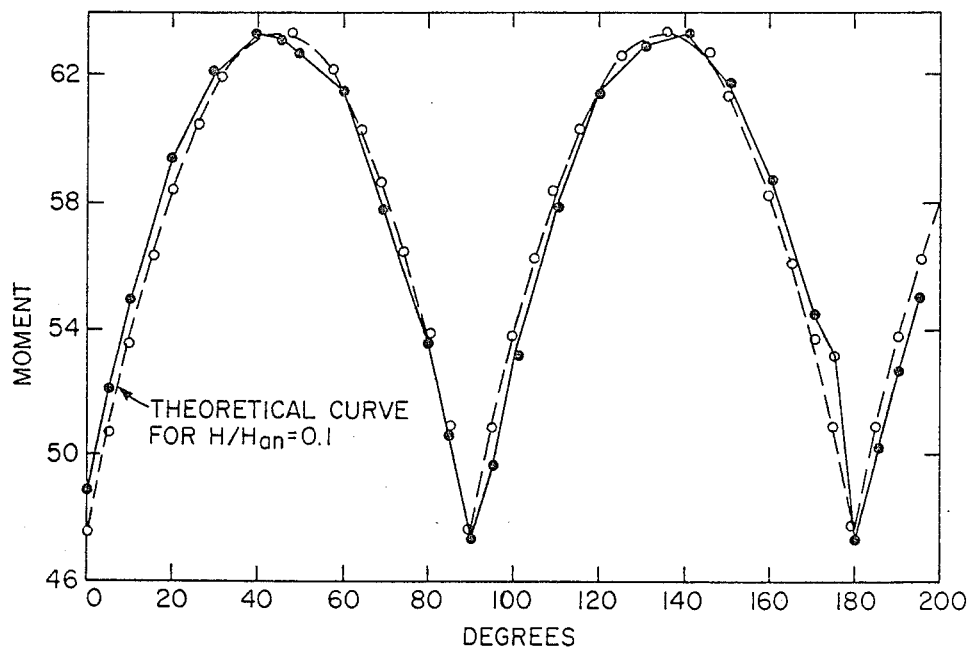
FIG. 22 is a plot of magnetic moment versus orientation of a magnetic field expressed in degrees.

Referring to FIGS. 20-22, the magnetic properties of the films have also been studied by measuring the magnetic moment as a function of orientation and field strength using a vibrating sample magnetometer.

With the magnetic field and hence the magnetic moment in the plane of the film, the anisotropy energy is given by $$E_{anis} = (K_1/4) \sin^2(2\theta) \quad (16)$$

where $K_1$ is the first order anisotropy constant and $\theta$ is the angle between the magnetic moment and one of the in-plane easy axes (for instance <010>, FIG. 20). With the field applied at an angle $\theta_0$ to the in-plane easy axis, the total energy (sum of anisotropy and Zeeman energies) is $$E = \frac{1}{4} K_1 \sin^2 2(\theta_0 - \theta_1) - HM_s \cos\theta_1, \quad (17)$$

where $\theta_1$ is the angle between magnetic moment and magnetic field as shown in FIG. 20, H the field strength and $M_s$ the saturation magnetization. The condition for minimal energy $\partial E/\partial \theta_1 = 0$ can be solved explicitly for $\theta_0$ with the result $$\theta_o = \theta_1 + \frac{1}{4} \sin^{-1}\left[\frac{4H}{H_{an}} \cdot \sin\theta_1\right], \quad (18)$$

where $H_{an} = 2K_1/M_s$ is the anisotropy field. The magnetometer measures the projection of the magnetization vector on the magnetic field direction, i.e.

$$\text{magnetic moment } \alpha M_s \cos\theta_1 \quad (19)$$

Equations (18) and (19) can therefore be used to calculate the dependence of the magnetic moment on the strength and orientation of the magnetic field.

The magnetic measurements were performed on a film of 200 nm thickness. FIG. 21 shows the reduced magnetization as a function of field strength when the field is applied along a <011> direction (i.e. along a "hard", in-plane axis). The theoretical curve for $M/M_s$ (calculated from (18) and (19)) rises from $1/\sqrt{2}$ (for H=0) to 1 (for $H/H_{an}=1$) and has a discontinuous slope at $H/H_{an}=1$ (solid line labeled $\theta_o = 45°$ in FIG. 21). Theoretical curves corresponding to slight misalignment between field and inplane hard direction are shown as broken lines in FIG. 21. The data points (crosses) generally lie between theoretical curves for $\theta_o=45°$ and 43°. The anisotropy field inferred from these measurements is 550 Oe, which agrees with the accepted value for bulk iron.

FIG. 22 shows the results of measurements of the magnetic moment as a function of field orientation at a fixed fieldstrength of 50 Oe. The theoretical curve for $H_{an}/H=0.1$ (open circles) is in good agreement with the experimental data (solid circles). The sharp dips in the curve occur at the in-plane hard axes of the film. The slope of the theoretical curves is discontinuous at this orientation, because the magnetization vector is inclined towards different easy axes on the two sides of the dip. The experimental data show a slight hysteresis in the vicinity of the hard-axis dips.

Figure 23:
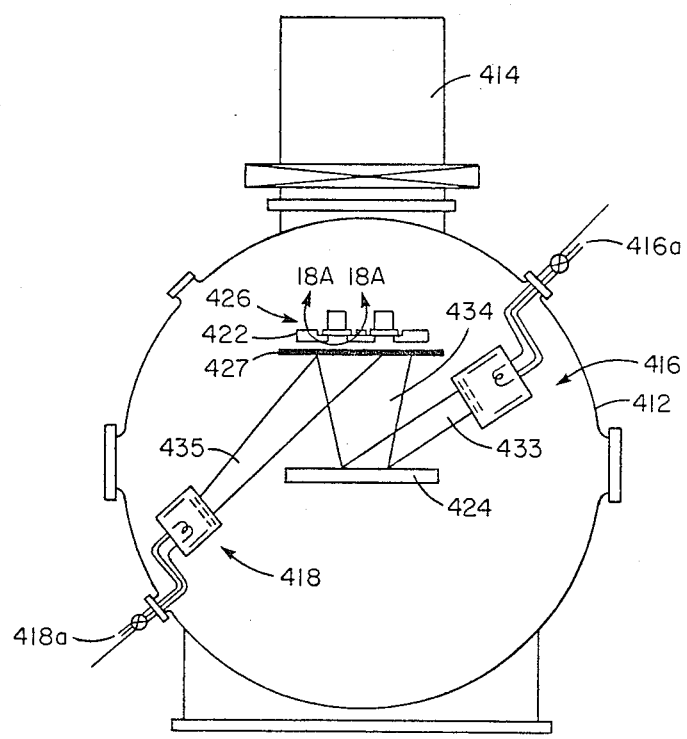
FIG. 23 is a schematic representation of an alternate embodiment of an ion beam sputterer used to grow a naturally anisotropic magnetic layer.

Referring now to FIGS. 23, an alternate embodiment of an ion beam apparatus which provides high kinetic energy electrons at substantially reduced substrate temperatures is shown to include the apparatus as described in conjunction with FIG. 18, further including a second ion gun 418 fed via a second inlet port 418a as shown. Here the ion gun 418 produces an ion beam 435 which may be used in a pregrowth step to etch the surface of the gallium arsenide substrate 411 to provide a more suitable surface for epitaxial growth of the metal layer. The gun 418 is also used during growth of the layer to provide ions having energies in the range of about 100 to 500 eV to impart an additional and variable amount of kinetic energy to the metal atoms migrating on the surface of the film and, thereby provide higher film qualities at lower substrate temperatures. It is believed that the increased amount of kinetic energy can lead to enhanced surface diffusion of the atoms on the substrate, permitting the atoms be provided in proper lattice locations on the single crystal metal film at substantially lower substrate temperatures of about 25° C. up to 350° C.

Having described preferred embodiments in the invention, it will now become apparent to one of the skill in the art that other embodiments incorporating their concepts may be used. For example, the magnetic storage element 30 may be located in various portions of the flip-flop of FIG. 2 as described for element 30' (FIGS. 10A, 10B). Moreover, element 30' as described in conjunction with FIGS. 10A, 10B may have the alternate locations in FIGS. 6-9. It is felt, therefore, that these embodiments should not be limited to disclosed embodiments, but rather should be limited only to by the spirit and scope of the appended claims.

What is claimed is:

1. A memory element comprising:
   means for providing a flip-flop circuit; and
   means for inducing an asymmetrical response in said flip-flop circuit means comprising:
   (i) at least one thin layer comprised of a magnetic material disposed to have one of a pair of mutually orthogonal remanent magnetization states; and
   (ii) means connected to said flip-flop means for responding to the remanent magnetization in said thin layer of magnetic material.

2. The memory element of claim 1 wherein said thin magnetic layer has a thickness in the range of about 100 A to 1000 A.

3. The memory storage element as recited in claim 2 wherein the thin magnetic layer is comprised of a magnetic material having a natural anisotropy to provide a pair of mutually orthogonal remanent magnetization states.

4. The memory storage element as recited in claim 2 wherein the means for responding to the remanent magnetization comprises a pair of conductors disposed orthogonal to one another and magnetically coupled to the mutually orthogonal remanent magnetization directions of the magnetic material.

5. The memory storage element as recited in claim 4 wherein the thin layer comprised of magnetic material has an induced anisotropy to provide the pair of mutually orthogonal remanent magnetization states.

6. The memory storage element as recited in claim 5 wherein the magnetic material is selected from the group consisting of iron, iron-nickel alloys, iron-cobalt alloys, ferrites, and garnets.

7. The memory storage element as recited in claim 6 wherein the means for providing a flip-flop circuit includes a pair of transistors.

8. The memory storage element as recited in claim 7 wherein the transistors are field effect transistors.

9. The memory storage element as recited in claim 4 wherein the magnetic layer is comprised of a magnetic material having a natural anisotropy to provide the pair of mutually orthogonal remanent magnetization states.

10. The memory storage element as recited in claim 9 wherein the means for providing a flip-flop circuit includes a pair of transistors.

11. The memory storage element as recited in claim 10 wherein the transistors are field effect transistors.

12. In combination:
a pair of transistors each having an input electrode and an output electrode with the input electrode of one transistor being connected to the output electrode of the other transistor; and
a magnetic thin film storage element coupled to said pair of transistors, comprising:
(i) means for providing a pair of mutually orthogonal remanent magnetization states; and
(ii) a pair of conductors disposed to be magnetically coupled to said pair of mutually orthogonal remanent magnetization states, and disposed to couple said magnetic thin film storage element to said pair of transistors.

13. The combination of claim 12 wherein the means for providing a pair of mutually orthogonal remanent magnetization states includes a single magnetic material layer.

14. The combination of claim 13 wherein the magnetic layer has an induced biaxial anisotropy.

15. The combination of claim 14 wherein the single magnetic material layer is disposed between the pair of conductors.

16. The combination of claim 15 wherein the pair of conductors are disposed mutually orthogonal to one another and dielectrically cross each other in a region of said single magnetic material layer.

17. The combination of claim 16 wherein the thin layer of magnetic material has a high coercivity to stabilize the remanent magnetization states.

18. The combination as recited in claim 16 wherein the thin magnetic material is selected from the group consisting of iron, iron-nickel alloys, iron cobalt alloys, ferrites and garnets.

19. The combination as recited in claim 13 wherein said combination further comprises a substrate having a predetermined crystallographic orientation, with said substrate supporting the pair of transistors and the magnetic thin film storage element, and wherein said magnetic material is an epitaxial, single crystal magnetic material disposed on said substrate in a second predetermined crystallographic orientation.

20. The combination of claim 19 wherein said epitaxial magnetic material has the same orientation as said substrate.

21. The combination of claim 20 wherein said pair of conductors each include a plurality of conductor portions, disposed over the epitaxial magnetic material having a plurality of regions where said pluralities of conductor portions dielectrically and orthogonally cross each other at corresponding regions of said single crystal epitaxial magnetic material.

22. The combination of claim 21 wherein the epitaxial magnetic material is disposed in a single layer.

23. The combination of claim 21 wherein the epitaxial magnetic material is disposed in a plurality of regions of said material, underlying regions where said pluralities of strip conductor portions cross.

24. The combination of claim 20 wherein said pair of conductors each include at least a pair of plurality of conductor portions, a first plurality of conductor portion of said pair of conductors disposed at a first elevation over the epitaxial magnetic layer, and a second plurality of conductor portions of the pair of conductors disposed at a second different elevation over the epitaxial magnetic layer.

25. The combination of claim 24 wherein the pair of plurality of conductor portions of one of said pair of conductors dielectrically cross portions of the pair of plurality of conductor portions of the second one of said pair of conductors.

26. The combination of claim 25 wherein the portion of said crossing conductors are mutually orthogonal.

27. The combination of claim 25 further comprising a second layer of a magnetic material disposed to provide a flux return path for the magnetization in said epitaxial magnetic material.

28. The combination of claim 20 further comprising a second layer of a magnetic material disposed to provide a flux return path for the magnetization in said epitaxial magnetic material.

29. The combination of claim 20 wherein the means for providing a pair of mutually orthogonal remanent magnetization states includes a pair of magnetically coupled, magnetic material layers.

30. The combination of claim 29 wherein the pair of magnetic materials each have an induced anisotropy.

31. The combination of claim 30 wherein the pair of conductors are disposed between the pair of magnetically coupled magnetic material layers.

32. The combination of claim 31 wherein the pair of conductors are disposed mutually orthogonal to one another and dielectrically cross each other in a region of said pair of magnetic material layers.

33. The combination of claim 32 wherein the magnetic material is selected from the group consisting of iron, iron-cobalt alloys, iron-nickel alloys, ferrites and garnets.

34. The combination as recited in claim 12 wherein the means for providing a pair of mutually orthogonal remanent magnetization states includes a magnetic material having a natural bi-axial anisotropy.

35. The combination of claim 34 wherein said magnetic material is iron having a pair of easy axes oriented with respect to the pair of conductors.

36. The combination of claim 34 wherein the magnetic material is an epitaxial, single crystal material.

37. The combination of claim 36 wherein said epitaxial magnetic material is iron having a pair of easy axes oriented with respect to the pair of conductors.

38. The combination of claim 36 wherein said pair of conductors are disposed over the epitaxial magnetic material.

39. The combination of claim 38 wherein the pair of conductors are disposed mutually orthogonal to one another and dielectrically over each other in a region of said single coupled epitaxial magnetic material.

40. The combination of claim 34 wherein said pair of conductors each include a plurality of conductor portions, disposed over the epitaxial magnetic material having a plurality of regions where said pluralities of conductor portions dielectrically and orthogonally cross each other at corresponding regions of said single crystal epitaxial magnetic material.

41. The combination of claim 40 wherein the epitaxial magnetic material is disposed in a single layer.

42. The combination of claim 41 wherein said epitaxial magnetic material is iron having a pair of easy axes oriented with respect to the pair of conductors.

43. The combination of claim 40 wherein the epitaxial magnetic material is disposed in a plurality of regions of said material, underlying regions where said pluralities of strip conductor portions cross.

44. The combination of claim 43 wherein said epitaxial magnetic material is iron having a pair of easy axes oriented with respect to the pair of conductors.

45. The combination of claim 40 further comprising a second layer of a magnetic material disposed to provide a flux return path for the magnetization in said epitaxial magnetic material.

46. The combination of claim 40 wherein said epitaxial magnetic material is iron having a pair of easy axes oriented with respect to the pair of conductors.

47. The combination of claim 34 further comprising a second layer of a magnetic material disposed to provide a flux return path for the magnetization in said epitaxial magnetic material.

48. The combination of claim 34 wherein said pair of conductors each include at least a pair of pluralities of conductor portions with a first plurality of conductor portions of said pair of conductors disposed at a first elevation over the epitaxial magnetic layer, and a second plurality of conductor portions of the pair of conductors disposed at a second different elevation over the epitaxial magnetic layer.

49. The combination of claim 48 wherein the pair of plurality of conductor portions of one of said pair of conductors dielectrically cross portions of the pair of plurality of conductor portions of the second one of said pair of conductors.

50. The combination of claim 49 wherein the portion of said crossing conductors are mutually orthogonal.

51. The combination of claim 50 wherein the epitaxial magnetic material is disposed in a single layer.

52. The combination of claim 51 further comprising a second layer of a magnetic material disposed to provide a flux return path for the magnetization in said epitaxial magnetic material.

53. The combination of claim 50 wherein the epitaxial magnetic material is disposed in a plurality of regions of said material, underlying regions where said pluralities of strip conductor portions cross.

54. The combination of claim 53 further comprising a second layer of a magnetic material disposed to provide a flux return path for the magnetization in said epitaxial magnetic material.

55. The combination of claim 50 further comprising a second layer of a magnetic material disposed to provide a flux return path for the magnetization in said epitaxial magnetic material.

56. The combination of claim 55 wherein said epitaxial magnetic material is iron having a pair of easy axes oriented with respect to the pair of conductors.

57. The combination of claim 50 wherein said magnetic material is iron having a pair of easy axes oriented with respect to the pair of conductors.

58. A memory storage element comprising:
a substrate;
means, including a pair of transistors disposed on said substrate connected by a pair of cross-coupled paths, disposed for providing a flip-flop;
a thin film storage element disposed in said cross-coupled path comprising:
a thin magnetic film disposed over said substrate having a pair of mutually orthogonal remanent magnetization states; and
a pair of conductors disposed to be magnetically coupled to said pair of magnetization states with said pair of conductors disposed to provide part of the pair of cross-coupled paths.

59. A memory storage element comprising:
a substrate;
means, including a pair of transistors having input and output electrodes disposed on said substrate connected by a pair of cross-coupled paths with the input electrode of one transistor being connected to the output of the other transistor for providing a flip-flop; and
a thin film storage element comprising:
a thin magnetic film disposed over said substrate having a pair of mutually orthogonal remanent magnetization states; and
a pair of conductors disposed to be magnetically coupled to said pair of magnetization states with said pair of conductors disposed between the input electrode of said transistors and a common potential.

60. The memory storage element as recited in claim 59 further comprising a separate pair of conductors disposed over the thin magnetic film to change the orientation of the magnetization in said film.

61. The memory storage element as recited in claim 59 wherein said conductor disposed to couple to the pair of magnetization states are used to change the orientation of the magnetization states.

62. The memory element of claim 59 wherein said film has a thickness in the range of about 100 A to 1000 A.

63. The memory storage element as recited in claim 59 wherein the pair of conductors are disposed orthogonal to one another and magnetically coupled to the mutually orthogonal remanent magnetization directions of the magnetic material.

64. The memory storage element as recited in claim 63 wherein the magnetic material has an induced anisotropy to provide the pair of mutually orthogonal remanent magnetization states.

65. The memory storage element as recited in claim 64 wherein the magnetic material is selected from the group consisting of iron, iron-cobalt alloys, iron-nickel alloys, ferrites and garnets.

66. The memory storage element as recited in claim 65 wherein the means for providing a flip-flop circuit includes a pair of field effect transistors.

67. The memory storage element as recited in claim 66 wherein the transistors are metal electrode field effect transistors.

68. The memory storage element as recited in claim 63 wherein the magnetic film is comprised of a magnetic material having a natural anisotropy to provide the pair of mutually orthogonal remanent magnetization states.

69. The memory storage element as recited in claim 68 wherein the magnetic material is <100> orientated iron disposed on a <100> orientated substrate.

70. The memory storage element as recited in claim 69 wherein the substrate is gallium arsenide.

71. The memory storage element as recited in claim 70 wherein the means for providing a flip-flop circuit includes a pair of field effect transistors.

72. The memory storage element as recited in claim 71 wherein the transistors are metal electrode field effect transistors.

73. A memory storage element comprising:
a substrate;
means, including a pair of transistors disposed on said substrate connected by a pair of cross-coupled paths for providing a flip-flop;
a thin film storage element comprising:
 a thin magnetic film disposed over said substrate having a pair of mutually orthogonal remanent magnetization states;
 a pair of conductors disposed to be magnetically coupled to said pair of magnetization states; and
 means including said pair of conductors disposed to coupled said flip-flop cross-coupled path to a voltage potential.

* * * * *

UNITED STATES PATENT AND TRADEMARK OFFICE
CERTIFICATE OF CORRECTION

PATENT NO. : 4,887,236                                    Page 1 of 3

DATED : Dec. 12, 1989

INVENTOR(S) : Ernst F.R.A. Schloeman

It is certified that error appears in the above-identified patent and that said Letters Patent is hereby corrected as shown below:

On title page, Attorney, Agent, or Firm, delete "Moloney" and replace with
--Maloney--.

Col. 4, line 11, after "following" insert-- detailed description--; and line 30 after "memory" insert --cell shown--.

Col. 6, line 56, delete "coercively" and replace with
--coercivity--.

Col. 11, line 59, delete "anisotropic" and replace with
--anistrophy--.

Col. 14, line 1, delete "E" and replace with --WE--.

Col. 17, line 19, delete "extreme" and replace with
--extremum--.

UNITED STATES PATENT AND TRADEMARK OFFICE
CERTIFICATE OF CORRECTION

PATENT NO. : 4,887,236
DATED : Dec. 12, 1989
INVENTOR(S) : Ernst F.R.A. Schloeman It is certified that error appears in the above-identified patent and that said Letters Patent is hereby corrected as shown below:

line 34, delete "$\tilde{z}=z=\sqrt{K_u/A}$, $d=\sqrt{K_u/A}$" and replace with --$z=\sqrt{K_u/A}$, $d=\sqrt{K_u/A}$--

Col. 18, line 16, delete "($\theta=°0$," and replace with --($\theta=0$,--;

Col. 18, line 19, delete "0 for $z>0$" and replace with --0 for $z<0$--;

Col. 18, line 25, after "$\theta$ on $\tilde{z}$" insert --completely--;

line 30, delete "extreme" and replace with --extrema--;

line 36, delete "$\theta z)-\theta_0=-[\theta(-\tilde{z})-\theta 0]$." and replace with --$\theta(\tilde{z}) - \theta_0 = - [\theta(-\tilde{z})-\theta 0]$.--;

line 59, delete "$\psi_{10}$ with" and replace with --with $\psi_{10}$--;

UNITED STATES PATENT AND TRADEMARK OFFICE
CERTIFICATE OF CORRECTION

PATENT NO. : 4,887,236
DATED : Dec. 12, 1989
INVENTOR(S) : Ernst F.R.A. Schloeman It is certified that error appears in the above-identified patent and that said Letters Patent is hereby corrected as shown below:

Col. 23, line 23, Claim 9 after "wherein the", insert
--thin--; and

Col. 26, line 12, Claim 57 insert epitaxial before the word "magnetic".

Signed and Sealed this

Sixteenth Day of November, 1993

Attest:

BRUCE LEHMAN

Attesting Officer    Commissioner of Patents and Trademarks